United States Patent
Kijima et al.

(10) Patent No.: US 7,262,450 B2
(45) Date of Patent: Aug. 28, 2007

(54) MFS TYPE FIELD EFFECT TRANSISTOR, ITS MANUFACTURING METHOD, FERROELECTRIC MEMORY AND SEMICONDUCTOR DEVICE

(75) Inventors: Takeshi Kijima, Nagano (JP); Yasuaki Hamada, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/108,933

(22) Filed: Apr. 19, 2005

(65) Prior Publication Data

US 2005/0236652 A1 Oct. 27, 2005

(30) Foreign Application Priority Data

Apr. 23, 2004 (JP) ............................. 2004-128692

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ............................. 257/295; 257/E29.272
(58) Field of Classification Search ............... 257/213, 257/295
See application file for complete search history.

(56) References Cited

U.S. PATENT DOCUMENTS

| | | | | |
|---|---|---|---|---|
| 5,552,623 A | * | 9/1996 | Nishizawa et al. | 257/345 |
| 6,825,517 B2 | * | 11/2004 | Dimmler et al. | 257/295 |
| 6,908,802 B2 | * | 6/2005 | Ramesh | 438/200 |
| 2003/0227803 A1 | * | 12/2003 | Natori et al. | 365/200 |

FOREIGN PATENT DOCUMENTS

| KR | 2001-0037449 | 5/2001 |
|---|---|---|
| KR | 2003-0036405 | 5/2003 |

OTHER PUBLICATIONS

Communication from Korean Patent Office regarding counterpart application.

* cited by examiner

*Primary Examiner*—B. William Baumeister
*Assistant Examiner*—Dana Farahani
(74) *Attorney, Agent, or Firm*—Harness, Dickey & Pierce, P.L.C.

(57) ABSTRACT

A MFS type field effect transistor includes a semiconductor layer, a PZT system ferroelectric layer formed on the semiconductor layer, a gate electrode formed on the PZT system ferroelectric layer, and an impurity layer composing a source or a drain, formed in the semiconductor layer. The PZT system ferroelectric layer includes Nb that replaces a Ti composition by 2.5 mol % or more but 40 mol % or less.

14 Claims, 37 Drawing Sheets

NONE 0.5%

1%

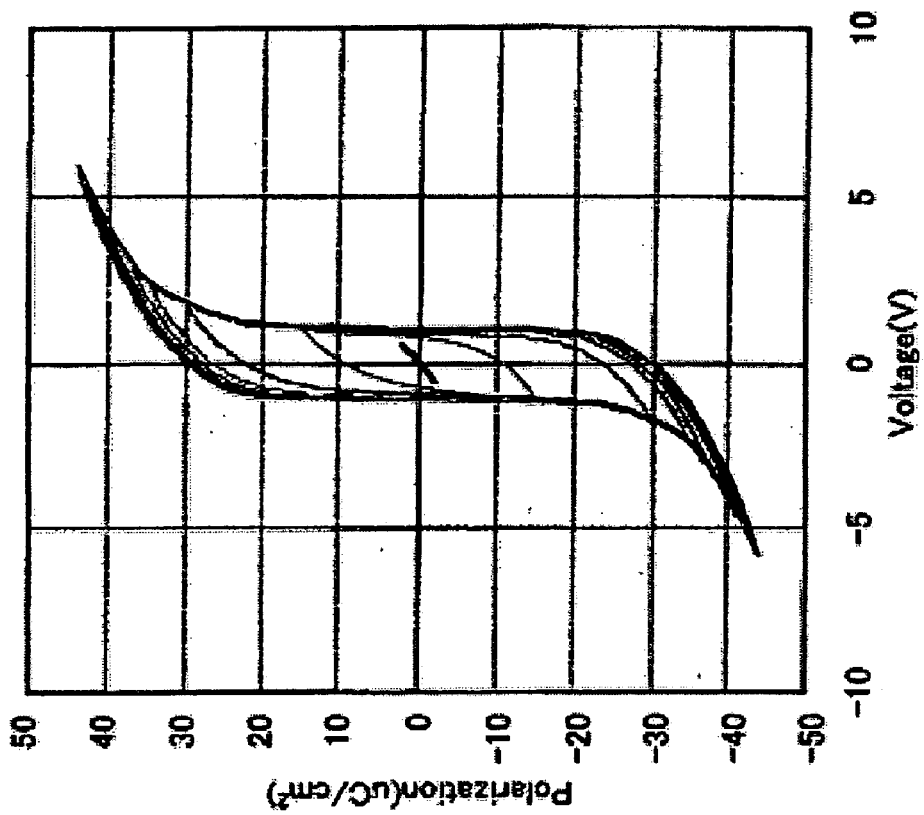
FIG. 17 (A) Nb=0 [mol%]
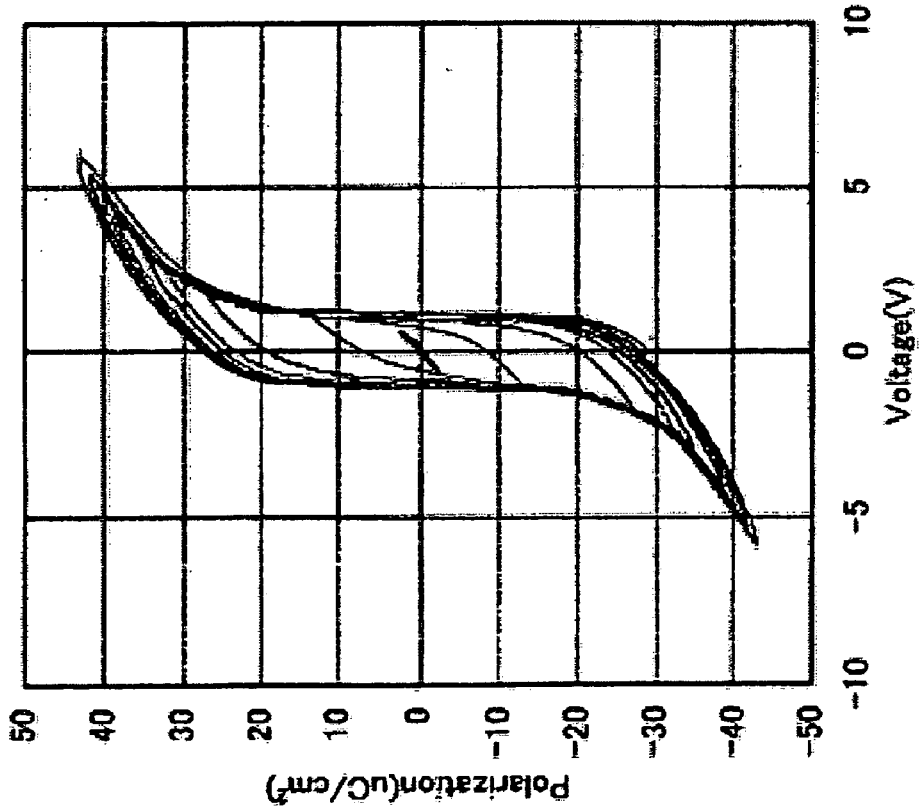
FIG. 17 (B) Nb=5 [mol%]

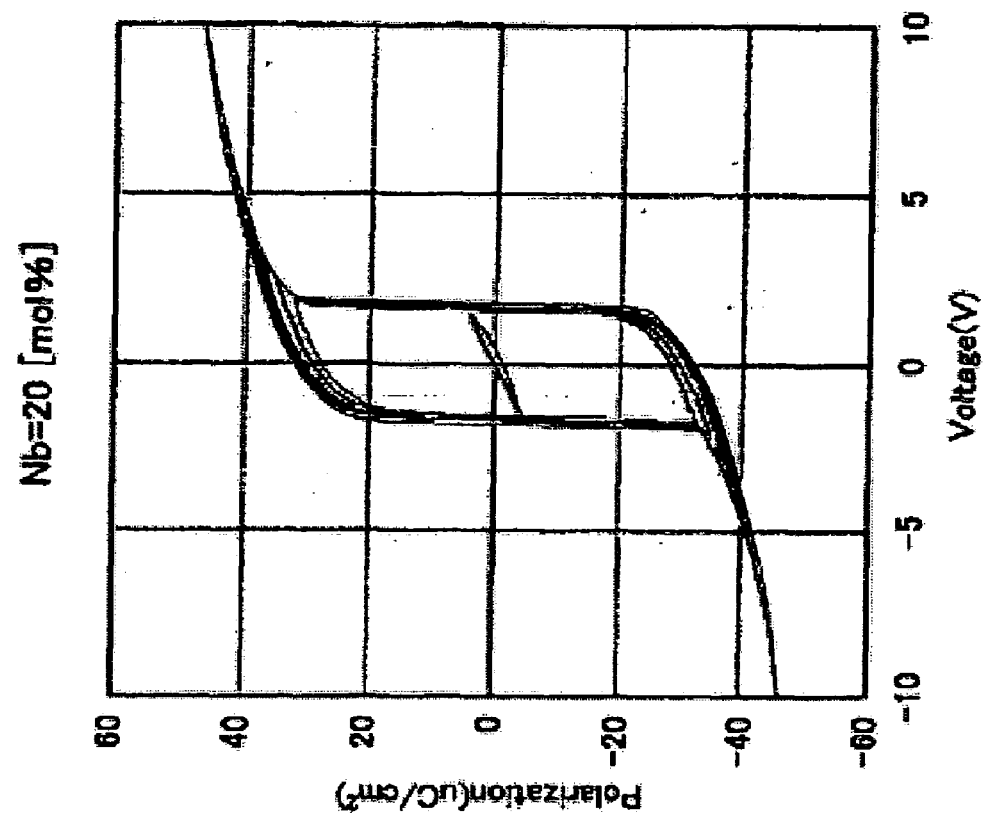
FIG. 18 (B) Nb=20 [mol%]
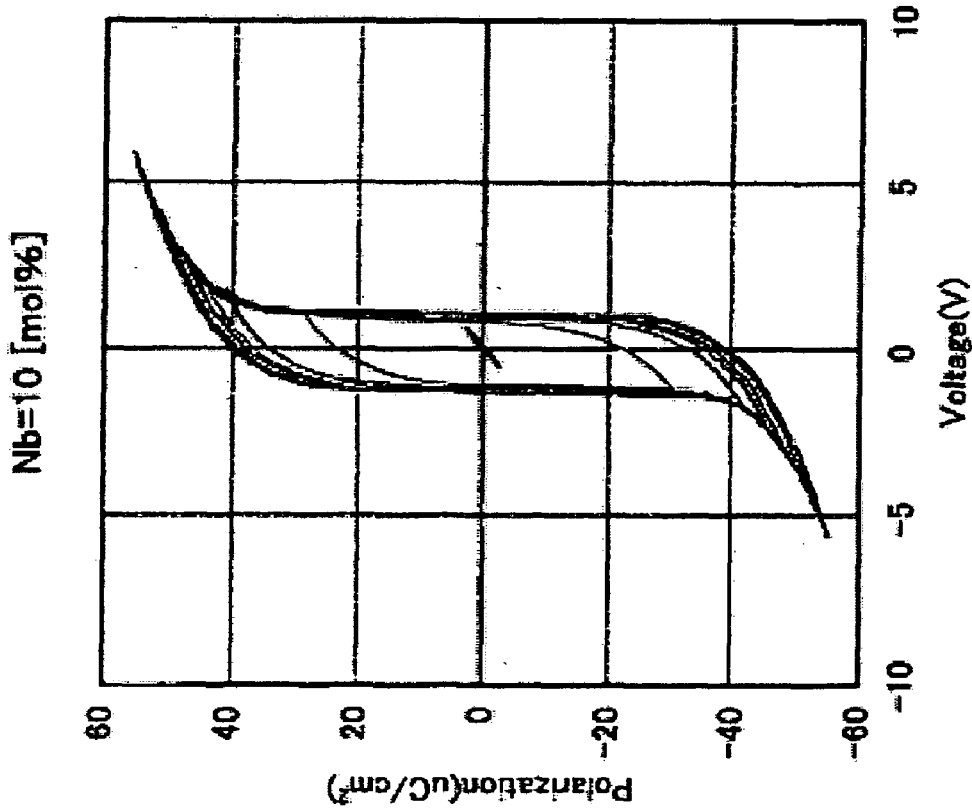
FIG. 18 (A) Nb=10 [mol%]

WO₃

| | AMOUNT OF Nb ADDED (mol %) | | | | | |
|---|---|---|---|---|---|---|
| | 0 | 5 | 10 | 20 | 30 |
| a | 4.04 | 4.04 | 4.01 | 4.00 | 4.00 |
| c | 4.11 | 4.11 | 4.10 | 4.05 | 4.03 |
| V(abc) | 67.0818 | 67.0818 | 65.9284 | 64.8000 | 64.4800 |
| V/V₀ | 100.0 | 100.0 | 98.3 | 96.6 | 96.1 |

DIFFUSION DISTANCE = FILM THICKNESS OF Pt X AREA 1 / (AREA 1 + AREA 2)

DIFFUSION DISTANCE = FILM THICKNESS OF Pt X DEPTH 1 / DEPTH 2

FIG. 39

| ELEMENT | ATOMIC WEIGHT | VALENCE IONIC RADIUS (Å) | ATOMIC RADIUS (Å) | BONDING ENERGY (M-O) (kcal/mol) | IONIZATION ENERGY (eV) |
|---|---|---|---|---|---|
| Pb | 207.2 | +2(1.08),+4(0.78) | 1.33 | 38.8 | 7.416 |
| Zr | 91.224 | +4(0.72) | 1.6 | | 6.84 |
| Ti | 47.88 | +2(0.86),+3,+4(0.61) | 1.47 | 73 | 6.82 |
| Nb | 92.906 | +3,+4,+5(0.64) | 1.47 | | 6.88 |
| O | 54.36 | -1,-2(1.4) | | | 13.618 |

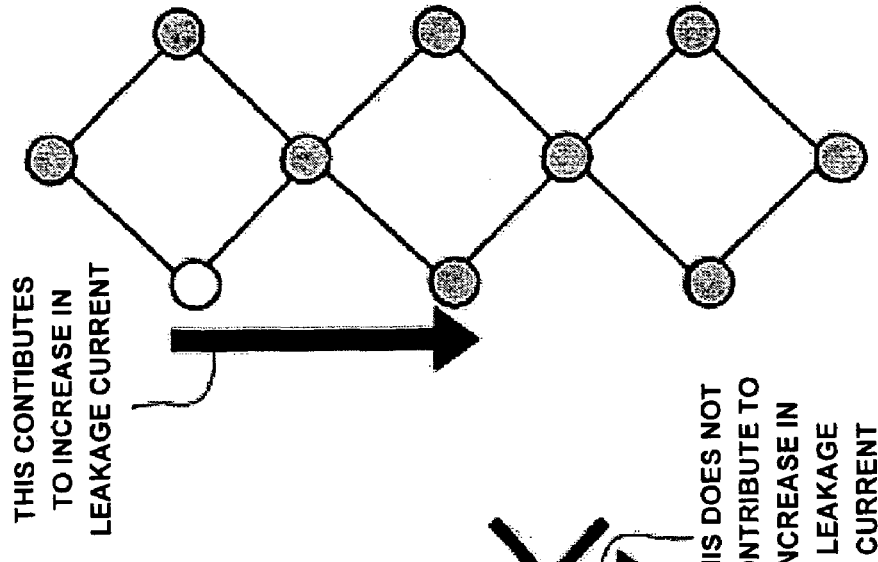
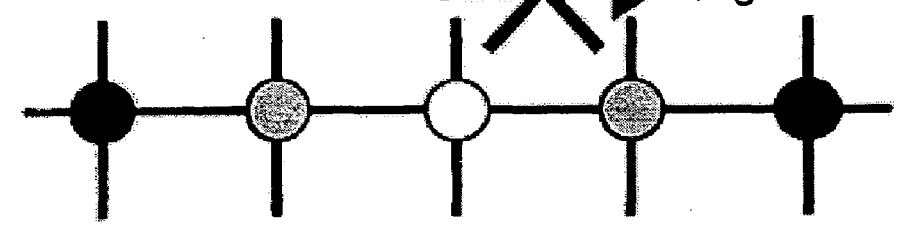
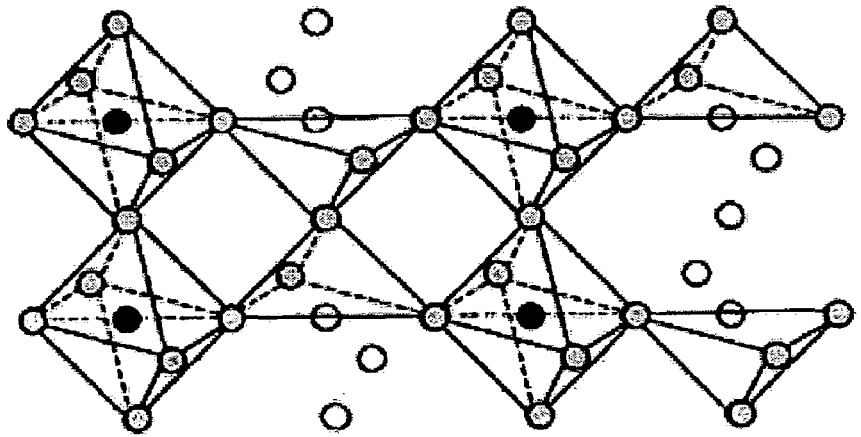

FIG. 41
POLARIZATION
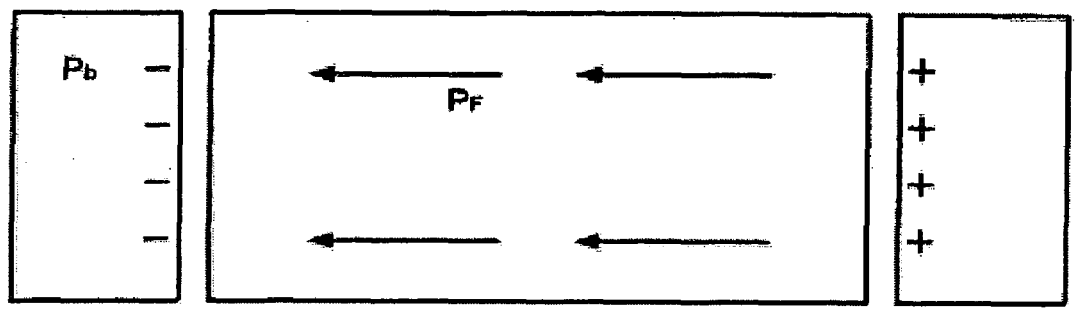
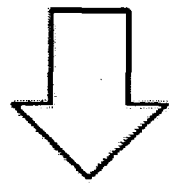
LEFT AT Tc
OR LOWER
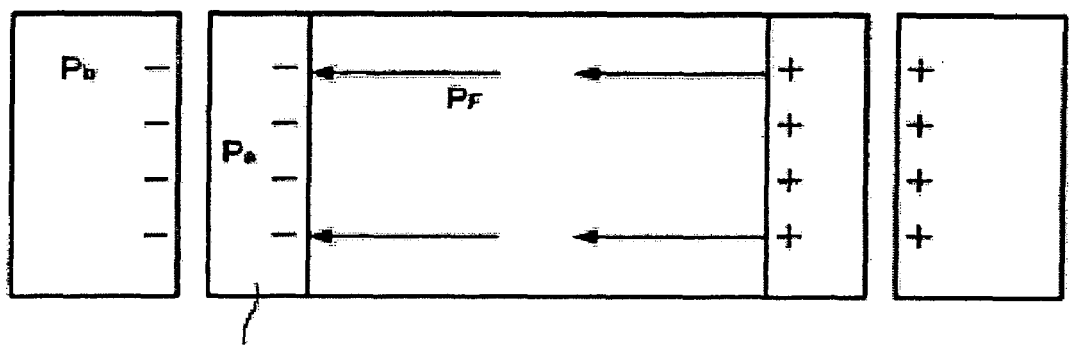
Pa ACTS IN DIRECTION THAT
CANCELS PF

MFS TYPE FIELD EFFECT TRANSISTOR, ITS MANUFACTURING METHOD, FERROELECTRIC MEMORY AND SEMICONDUCTOR DEVICE

RELATED APPLICATIONS

This application claims priority to Japanese Patent Application No. 2004-128692 filed Apr. 23, 2004 which is hereby expressly incorporated by reference herein in its entirety.

BACKGROUND

1. Technical Field

The present invention relates to MFS type field effect transistors, methods for manufacturing the same, ferroelectric memories and semiconductor devices.

2. Related Art

In recent years, research and development of ferroelectric layers such as PZT, SBT and the like, and ferroelectric memory devices using the same are extensively conducted. Above all, ferroelectric memories using MFS type field effect transistors (1T type) can achieve higher integration, and can readily perform non-destructive reading. The principle of the 1T type ferroelectric memory has been advocated for some tens of years, but is still far from practical use though various challenges have been made so far.

In a MFS type field-effect transistor, a ferroelectric layer is used for a gate insulation layer. However, it is difficult on the process to clean the interface between the ferroelectric layer and the semiconductor layer, and a $SiO_2$ layer is formed at the interface. The retention loss accompanying the leakage current is large, and the retention characteristic is not enough in such a structure. For this reason, a MFMIS structure in which a metallic middle electrode layer is disposed between a ferroelectric layer and an insulation layer has been proposed. However, a paraelectric capacitor is inserted in series with a ferroelectric capacitor in this structure, and a retention loss of data by a phenomenon that is called depolarization occurs. Methods of using a paraelectric material such as $HfO_2$ and the like with a comparatively high dielectric constant for the insulation layer are currently being examined against such a problem.

Pb (Zr, Ti) $O_3$ (PZT) is mainly used so far as a ferroelectric material. In the case of these materials, compositions in a region where rhombohedral and tetragonal coexist with the Zr/Ti ratio being 52/48 or 40/60 or compositions in the neighborhood thereof are used, and also these materials are used with an element such as La, Sr, Ca or the like being doped. This region is used because the reliability, which is most essential for memory devices, is to be secured. Although a Ti rich tetragonal region originally has a good hysteresis shape, Schottky defects that originate in ionic crystal structure occur in the tetragonal region. As a result, defects in leakage current characteristics or imprint characteristics (so-called degree of deformation of hysteresis) are generated, and thus it is difficult to secure the reliability.

Furthermore, although a tetragonal PZT shows a hysteresis characteristic having a squareness that is suitable for memory usage, its reliability is poor and it has not been put to practical use, because of the following reasons.

First, a PZT tetragonal thin film after crystallization has a tendency that the higher the Ti content rate, the higher the density of leakage current rises. In addition, when a so-called static imprint test is conducted, in which data is written once in a memory in either a positive (+) direction or a negative (−) direction, the memory is retained at 100° C., and the data is read, the data written scarcely remains in 24 hours. This is an intrinsic problem of PZT that is an ionic crystal and Pb and Ti that are constituent elements of the PZT, and this poses the most difficult problem of a PZT tetragonal thin film in which the majority of its constituent elements consists of Pb and Ti. This problem is largely attributable to the fact that the PZT perovskite is an ionic crystal, which is an intrinsic problem of PZT.

FIG. 39 is a table showing main energies involved in the bonds of constituent elements of PZT. It is known that PZT after crystallization includes many oxygen vacancies. In other words, it is predicted from FIG. 39 that Pb-O bonds have the smallest bond energy among the PZT constituent elements, and may be readily break at the time of sintering and heating and at the time of polarization inversions. In other words, O escapes due to the principle of charge neutralization when Pb escapes.

Next, the constituent elements of PZT vibrate and repeatedly collide with one another during sustained heating such as at the time of imprint testing or the like. Because Ti is the lightest element among the PZT constituent elements, it would easily come off by these vibrational collisions during high-temperature retention. Therefore, O escapes due to the principle of charge neutralization when Ti escapes. Since the maximum valence of +2 for Pb and +4 for Ti contribute to bonding, there is no way to maintain charge neutrality other than allowing O to escape. In other words, two negative O ions escape readily for each positive ion of Pb or Ti, such that so-called Schottky defects easily form.

Descriptions are now made as to the mechanism of the generation of leakage currents due to oxygen vacancy in PZT crystals. FIGS. 40(A) to 45(C) are views for describing the generation of leakage currents in oxide crystals having a Brownmillerite type crystal structure expressed by the general formula of $ABO_{2.5}$. As shown in FIG. 40(A), the Brownmillerite type crystal structure is a crystal structure having an oxygen vacancy, as compared to a perovskite type crystal structure of PZT crystals having the general formula $ABO_3$. As shown in FIG. 40(B), because oxygen ions appear adjacent to positive ions in the Brownmillerite type crystal structure, positive ion defects would be difficult to cause leakage current to increase. However, as shown in FIG. 40(C), oxygen ions link the entire PZT crystal in series, and when the crystal structure becomes a Brownmillerite type crystal structure as the oxygen vacancy increases, leakage currents increase accordingly.

In addition to the generation of leakage currents described above, vacancies of Pb and Ti and the accompanying vacancy of O, which are lattice defects, cause a spatial charge polarization shown in FIG. 41. When that happens, reverse electrical fields due to lattice defects that are created by the electrical fields of ferroelectric polarization can occur, causing a state in which the bias potential is impressed to the PZT crystals, and, as a result, hysteresis shift or depolarization can occur. Moreover, these phenomena are likely to occur quicker as the temperature increases.

The problems described above are intrinsic to PZT and it is considered difficult to solve these problems in pure PZT, such that memory elements made by using tetragonal PZT having adequate characteristics have not been achieved so far.

It is an object of the present invention to provide MFS type field effect transistors having ferroelectric layers that would be difficult to have retention loss due to leakage currents and/or depolarization, and methods for manufacturing the same.

It is an object of the present invention to provide ferroelectric memories and semiconductor devices having MFS type field effect transistors in accordance with the present invention.

SUMMARY

A MFS type field effect transistor in accordance with the present invention includes: a semiconductor layer; a PZT system ferroelectric layer formed on the semiconductor layer; a gate electrode formed on the PZT system ferroelectric layer; and an impurity layer composing a source or a drain, formed in the semiconductor layer, wherein the PZT system ferroelectric layer includes Nb that replaces Ti composition by 2.5 mol % or more but 40 mol % or less.

In the MFS type field effect transistor in accordance with the present invention, a diffusion length of oxygen in the gate electrode from the PZT system ferroelectric layer may be 15 nm or less, as obtained from a profile according to a Rutherford backscattering analysis method (RBS) and a nuclear reaction analysis method (NRA).

In the MFS type field effect transistor in accordance with the present invention, a diffusion length of oxygen in the gate electrode from the PZT system ferroelectric layer may be 30 nm or less, as obtained from a profile according to an Auger electron spectroscopy (AES).

In the MFS type field effect transistor in accordance with the present invention, the PZT system ferroelectric layer may have a generally constant distribution of proportion of oxygen atoms in the PZT system ferroelectric layer.

In the MFS type field effect transistor in accordance with the present invention, the distribution of proportion of oxygen atoms in the PZT system ferroelectric layer may be 1% or less, when a difference in proportions of oxygen atoms in the PZT system ferroelectric layer in a film thickness direction thereof is expressed by (a maximum value–a minimum value)/(an average value of the maximum value and the minimum value) and obtained from a profile according to a Rutherford backscattering analysis method (RBS) and a nuclear reaction analysis method (NRA).

In the MFS type field effect transistor in accordance with the present invention, the distribution of proportion of oxygen atoms in the PZT system ferroelectric layer may be 3% or less, when a difference in proportions of oxygen atoms in the PZT system ferroelectric layer in a film thickness direction thereof is expressed by (a maximum value–a minimum value)/(an average value of the maximum value and the minimum value) and obtained from a profile according to an Auger electron spectroscopy (AES).

In the MFS type field effect transistor in accordance with the present invention, in the PZT system ferroelectric layer, 95% or more of oxygen contained in the PZT system ferroelectric layer may exist at positions of oxygen of a perovskite structure.

In the MFS type field effect transistor in accordance with the present invention, the PZT system ferroelectric layer may contain a Ti composition more than a Zr composition.

In the MFS type field effect transistor in accordance with the present invention, the PZT system ferroelectric layer may contain Nb that replaces a Ti composition by 5 mol % or more but 30 mol % or less.

In the MFS type field effect transistor in accordance with the present invention, the PZT system ferroelectric layer may contain Nb that replaces a Ti composition by 10 mol % or more but 30 mol % or less.

In the MFS type field effect transistor in accordance with the present invention, the PZT system ferroelectric layer may have a crystal structure of at least one of tetragonal and rhombohedral systems.

In the MFS type field effect transistor in accordance with the present invention, the PZT system ferroelectric layer may consist of a tetragonal system, and may have a (111) orientation.

In the MFS type field effect transistor in accordance with the present invention, the PZT system ferroelectric layer may include 0.5 mol % or more of Si, or Si and Ge.

In the MFS type field effect transistor in accordance with the present invention, the PZT system ferroelectric layer may include 0.5 mol % or more but less than 5 mol % of Si, or Si and Ge.

In the MFS type field effect transistor in accordance with the present invention, the PZT system ferroelectric layer main contain at least one of Ta, W, V and Mo that replaces all or a part of the Nb.

In the MFS type field effect transistor in accordance with the present invention, the gate electrode may consist of a platinum group element or an alloy thereof.

A method for manufacturing a MFS type field effect transistor in accordance with the present invention includes the steps of: forming, in a semiconductor layer, an impurity layer composing a source or a drain; forming a PZT system ferroelectric layer on the semiconductor layer; and forming a gate electrode on the PZT system ferroelectric, wherein the PZT system ferroelectric layer includes Nb that replaces Ti composition by 2.5 mol % or more but 40 mol % or less.

In the method for manufacturing a MFS type field effect transistor in accordance with the present invention, the PZT system ferroelectric layer may be formed by using a sol-gel solution.

In the method for manufacturing a MFS type field effect transistor in accordance with the present invention, a mixture of at least a sol-gel solution for $PbZrO_3$, a sol-gel solution for $PbTiO_3$, and a sol-gel solution for $PbNbO_3$ may be used as the sol-gel solution.

In the method for manufacturing a MFS type field effect transistor in accordance with the present invention, the mixture further containing a sol-gel solution for $PbSiO_3$ may be used as the sol-gel solution.

In the method for manufacturing a MFS type field effect transistor in accordance with the present invention, when a stoichiometric composition of Pb that is an A site constituent element is 1, the sol-gel solution containing Pb in a range between 0.9 and 1.2 is used to form the PZT system ferroelectric layer.

A ferroelectric memory in accordance with the present invention uses the MFS type field effect transistor in accordance with the present invention.

A semiconductor device in accordance with the present invention uses the ferroelectric memory in accordance with the present invention.

BRIEF DESCRIPTION OF THE DRAWINGS

FIGS. 17(A) and (B) show the hysteresis characteristics of PZTN films in accordance with Embodiment Example 2 of the present embodiment.

FIGS. 18(A) and (B) show the hysteresis characteristics of PZTN films in accordance with Embodiment Example 2 of the present embodiment.

FIG. 39 is a table showing various characteristics involved in the bonds of constituent elements of PZT ferroelectric.

FIGS. 40(A)-(C) are diagrams for describing Schottky defects of the Brownmillerite type crystal structure.

FIG. 41 shows diagrams for describing a spatial charge polarization of ferroelectric.

DETAILED DESCRIPTION

Preferred embodiments of the present invention are described below with reference to the accompanying drawings.

MFS Type Field Effect Transistor and Its Manufacturing Method

Figure 1:
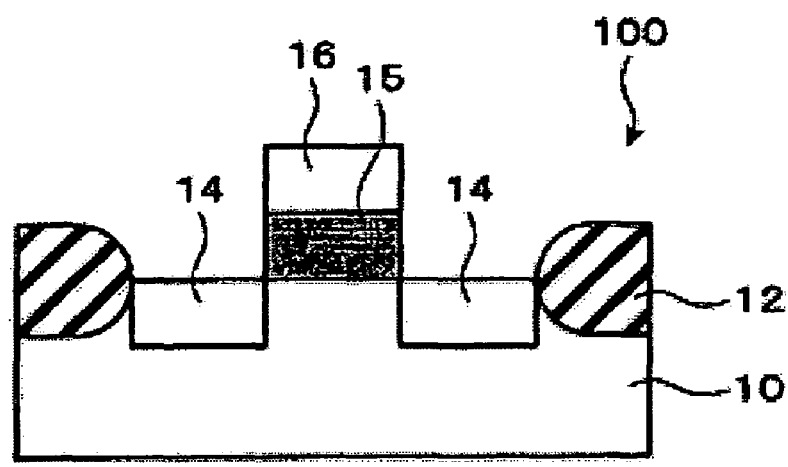
FIG. 1 shows a cross-sectional view schematically showing a MFS type field effect transistor in accordance with an embodiment.

FIG. 1 is a cross-sectional view schematically showing a MFS type field effect transistor in accordance with an embodiment of the present invention.

As shown in FIG. 1, the MFS type field effect transistor 100 includes a semiconductor layer 10 consisting of silicon or the like, a PZT system ferroelectric layer 15 formed on the semiconductor layer 10, a gate electrode 16 formed on the PZT system ferroelectric layer 15, and an impurity layer 14 composing a source or a drain formed in the semiconductor layer 10. The impurity layer 14 is formed by introducing N-type or P-type impurities in the semiconductor layer 10 by ion-implantation or the like.

The gate electrode 16 is formed from a single platinum group element such as Pt, Ir, Ru or the like, or a composite material containing as a main composition the aforementioned platinum group element. If the elements of the ferroelectric diffuse into the electrode 16, squareness of the hysteresis deteriorates due to differences in the compositions at the interface section between the gate electrode and the ferroelectric layer. Accordingly, the gate electrode 16 is required to have a density which does not allow diffusion of the elements of the ferroelectric. In order to increase the density of the gate electrode 16, a method of forming a film by sputtering using a gas with a large mass, or a method of dispersing an oxide of Y, La, or the like into the platinum group element may be employed. In the present embodiment, such methods as described above do not have to be adopted because almost no diffusion of oxygen from the ferroelectric layer 15 to the gate electrode 16 is recognized, as described below.

The ferroelectric layer 15 is formed by using PZT system ferroelectric that consists of an oxide including Pb, Zr, and Ti as its constituent elements. In particular, the present embodiment is characterized in that the ferroelectric layer 15 uses Pb (Zr,Ti,Nb)$O_3$ (PZTN) in which Nb is doped at the Ti site.

More specifically, the Ti composition of the ferroelectric layer 15 can be replaced with Nb by 2.5 mol % or more but 40 mol % or less, more preferably, 5 mol % or more but 30 mol % or less, and even more preferably, 10 mol % or more but 30 mol % or less.

In addition, the gate electrode 16 is characterized in that it hardly includes oxygen that diffuses from the ferroelectric layer 15. This is affirmed by the following analysis methods. More specifically, a diffusion length of oxygen in the gate electrode from the ferroelectric layer can be 15 nm or less, as obtained from a profile according to a Rutherford backscattering analysis method (RBS) and a nuclear reaction analysis method (NRA). Also, a diffusion length of oxygen in the gate electrode from the ferroelectric layer is 30 nm or less, as obtained from a profile according to an Auger electron spectroscopy (AES). Methods to obtain the diffusion length using these analysis methods are explained in detail below.

RBS and NRA are methods in which a high energy ion beam of several MeV is irradiated to sample atoms, and particles that come out by scattering or reaction are detected, whereby the distribution of elements of each kind in the depth direction is analyzed. Since there are elements that are well detected and elements that are not well detected for each of the methods, both of the methods are used together.

AES is a method in which an electron beam of several keV is irradiated to sample atoms, and electrons that are discharged are analyzed, whereby the ratio of elements of each kind adjacent to the sample surface is analyzed. Since AES can analyze only an area adjacent to the sample surface, the analysis is conducted while cutting the sample surface when the distribution of elements at each different depth is to be analyzed.

Neither RBS nor NRA is a commonly practiced method because they use a high energy ion beam, but they are analysis methods with high accuracy in the direction of depth because information on depth is contained in the detected particles. On the other hand, in AES, detected electrons do not contain information on depth, such that accuracy in the direction of depth is not as high as that of the former methods. But this is one of analysis methods that are commonly used, and is an analysis method with higher accuracy in the direction of depth among them.

As described above, the MFS type field-effect transistor of the present embodiment has a ferroelectric layer that is formed from PZTN, and even in a high temperature condition at 725° C., the diffusion of oxygen atoms of the ferroelectric layer into the gate electrode stops by the depth of several tens nm or less, as described later, which can be an extremely small diffusion length compared with PZT. Thus, because the diffusion of oxygen into the gate electrode is extremely little, and it can be said that such oxygen diffusion hardly exists compared with the conventional PZT, the squareness of hysteresis would not be deteriorated as a result of a compositional difference occurring at the interface section between the gate electrode and the ferroelectric layer.

Also, the MFS type field effect transistor in accordance with the present embodiment is characterized in that the ferroelectric layer has a generally constant distribution of proportion of oxygen atoms in the ferroelectric layer.

Concretely, the distribution of proportion of oxygen atoms in the ferroelectric layer may be 1% or less, when a difference in proportion of oxygen atoms in the ferroelectric layer in the direction of film thickness thereof is expressed by (a maximum value–a minimum value)/(an average value of the maximum value and the minimum value) and obtained from a profile according to RBS and NRA. Also, it may be 3% or less, when a similar difference is obtained from a profile according to AES. Concrete methods to obtain the difference in proportion of oxygen atoms are explained in detail below.

The fact that the ferroelectric layer has a little difference in proportion of oxygen atoms in the present embodiment means that almost all of the oxygen atoms are at lattice positions in the ferroelectric where they should originally be, and that breakage of the crystal lattice that originates in vacancies of oxygen atoms is hardly seen. In other words, it can be said that 95% or more of oxygen included in the ferroelectric layer can exist at the oxygen positions of the perovskite structure. This means that, not only oxygen that would most likely migrate, but also other elements such as Pb, Zr and Ti would be difficult to diffuse, and the film of PZTN itself has a barrier property, for example, a high oxygen barrier property.

This indicates at the same time that its barrier property to moisture ($H_2O$) is also high. In $H_2O$, hydrogen covalently bonds (strongly bonds) with oxygen, and a high level of oxygen barrier means a high level of resistance to moisture. In other words, a protection film (for example, $Al_2O_3$ film) that is to defend a piezoelectric element from the natural environment can be omitted, and a high piezoelectric constant of PZTN can be effectively used.

Also, the above is clear from Embodiment Example 4 to be described below. Thus, the ferroelectric layer that consists of PZTN does not diffuse oxygen, and has a high level of oxygen barrier property, such that a paraelectric film such as silicon oxide or the like is difficult to be generated at the interface between the semiconductor layer (for example, silicon layer) 10 and the ferroelectric layer 15, and the ferroelectric layer 15 can be formed directly on the semiconductor layer 10. It is noted that, when a paraelectric film such as silicon oxide or the like is formed at the interface between the semiconductor layer and the ferroelectric layer, the operation voltage not only increases, but a charge is also injected in the film due to a trap level generated, and the hysteresis characteristic deteriorates.

In addition, it is clear from embodiment examples to be described below, the ferroelectric layer 15 naturally has a high level of dielectric property, and excels in the hysteresis characteristic, the leakage characteristic, the fatigue characteristic, and the imprint characteristic. In view of these aspects, a MFS type field effect transistor can be sufficiently achieved in accordance with the present embodiment.

In the MFS type field effect transistor in accordance with the present embodiment, the ferroelectric layer may contain a Ti composition more than a Zr composition. More specifically, the ratio of Ti can be 50% or greater. Also, the ferroelectric layer may have a crystal structure of at least one of tetragonal and rhombohedral systems. The PZT system ferroelectric layer may preferably consist of a tetragonal system, and has a (111) orientation. By using PZTN with a (111) orientation as the ferroelectric layer, influences of the 90° domain can be eliminated, such that the depolarization can be suppressed, and the squareness of hysteresis characteristics can be made better.

In the present invention, it is believed that PZTN has the characteristics described above because of the following reasons. Because Nb has generally the same size as that of Ti (the ionic radii are close to each other and the atomic radii are the same) and weighs two times, it is hard for atoms to escape the lattice even by collision among atoms by lattice vibration. Also, the valence of Nb is stable at +5, so that even if the Pb escapes, the atomic weight after the Pb has escaped can be compensated for by the $Nb^{5+}$. Furthermore, during the crystallization, even if Pb escape occurs, it is easier for the small-sized Nb to enter than the large-sized O to escape.

Since there are also some Nb atoms with a valence of +4, it is possible that the substitution of $Ti^{4+}$ is performed sufficiently. In addition, it is believed that the covalence of Nb is extremely strong in practice, making it difficult for Pb to escape (see H. Miyazawa, E. Natori, S. Miyashita; Jpn. J. Appl. Phys. 39 (2000) 5679).

Until now, the Nb doping in PZT has been mainly performed into Zr-rich rhombohedral crystal regions and is extremely small, on the order of 0.2 to 0.025 mol % (see J. Am. Ceram. Soc, 84 (2001) 902 and Phys. Rev. Let, 83 (1999) 1347). The main reason why it has not been possible to dope a large amount of Nb is considered to be because the addition of 10 mol % of Nb, for example, would increase the crystallization temperature to at least 800° C.

In this case, $PbSiO_3$ silicate may preferably be further added at a rate of 1 to 5 mol %, for example, during the formation of the ferroelectric layer 15. This makes it possible to reduce the crystallization energy of the PZTN. In other words, if PZTN is used as the material of the ferroelectric layer 15, the addition of $PbSiO_3$ silicate makes it possible to design a reduction in the crystallization temperature of the PZTN.

Figure 32:
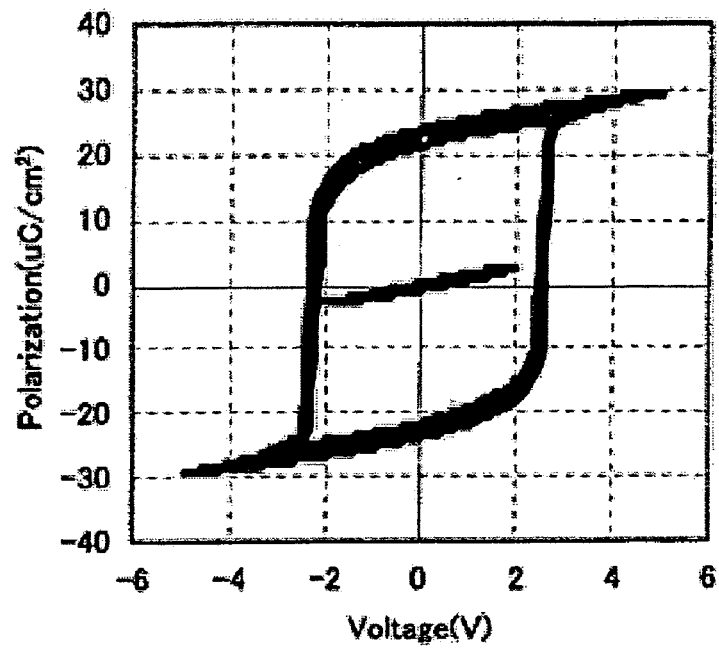
FIG. 32(A) and (B) show the hysteresis characteristics of ferroelectric layers in which Ta or W is added in PZT in accordance with the present embodiment.
Figure 32:
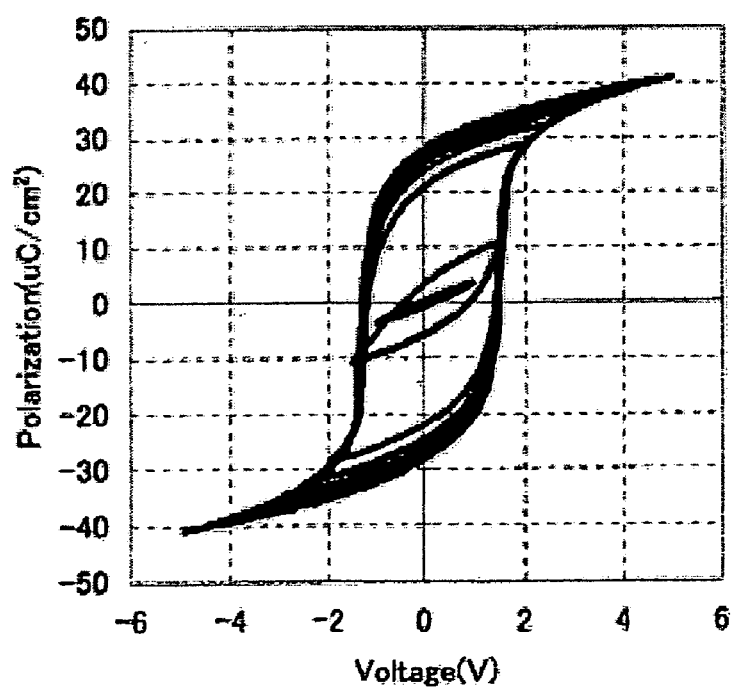

Also, in the present embodiment, the ferroelectric layer 15 is provided with equivalent effects when Ta, W, V, or Mo is added to PZT as an additive substance instead of Nb. Moreover, when Mn is used as an additive substance, effects similar to those provided by Nb are achieved. Further, in a similar idea, Pb may be replaced with an element with a valence of +3 or greater to prevent Pb from escaping. A lanthanoid system element, such as, La, Ce, Pr, Nd, Pm, Sm, Eu, Gd, Tb, Dy, Ho, Er, Tm, Yb, and Lu may be enumerated as a representative element. In addition, a germanate ($Ge^{2+}$) may be used instead of a silicate ($Si^{2+}$ ion) as an additive to promote the crystallization. FIG. 32(A) shows hysteresis characteristics when 10 mol % of Ta is used for PZT as an additive substance instead of Nb. Also, FIG. 32(B) shows hysteresis characteristics when 10 mol % of W is used for PZT as an additive substance instead of Nb. It is observed that effects equal to those provided by Nb are achieved when Ta is used. Moreover, it is also observed that effects equal to those provided by Nb are achieved when W is used, in view of the fact that hysteresis characteristics with an excellent insulation property are obtained.

Next, an example of a method for manufacturing a MFS type field effect transistor 100 in accordance with an embodiment of the present invention is described with reference to FIGS. 2(A) to 2(E).

First, as shown in FIG. 2(A), a resist layer (not shown) having opening sections at areas where an impurity layer is to be formed is formed on a semiconductor layer 10 consisting of silicon or the like. Then, impurities are introduced in the semiconductor layer 10 by ion-implantation or the like, such that an impurity layer 14 composing a source or a drain is formed.

Then, as shown in FIG. 2(B), a mask layer 13 consisting of, for example, salicide is formed by using lithography and etching techniques over a device forming area including the impurity layer 14.

Then, as shown in FIG. 2(C), an element isolation region 12 is selectively formed in areas other than the mask layer 13 by thermal oxidation.

Then, as shown in FIG. 2(D), the mask layer 13 is removed by wet-etching or the like. As a result of the mask layer 13 being removed, the surface of the semiconductor layer 10 is made to have a clean state.

Then, as shown in FIG. 2(E), a ferroelectric layer 15a and an electrode layer 16a are successively formed on the semiconductor layer 10 that is maintained to be clean.

The ferroelectric layer 15a consisting of PZTN can be obtained by preparing a mixed solution of first—third raw material liquids including at least one of Pb, Zr, Ti and Nb, and crystallizing oxides contained in the mixed solution by heat treatment or the like.

The first raw material liquid may be, for example, a solution in which a condensation polymer for forming $PbZrO_3$ perovskite crystal with Pb and Zr among the constituent metal elements of the PZTN ferroelectric phase is dissolved in a solvent such as n-buthanol in an anhydrous state.

The second raw material liquid may be, for example, a solution in which a condensation polymer for forming $PbTiO_3$ perovskite crystal with Pb and Ti among the constituent metal elements of the PZTN ferroelectric phase is dissolved in a solvent such as n-buthanol in an anhydrous state.

The third raw material liquid may be, for example, a solution in which a condensation polymer for forming $PbNbO_3$ perovskite crystal with Pb and Nb among the constituent metal elements of the PZTN ferroelectric phase is dissolved in a solvent such as n-buthanol in an anhydrous state.

For example, when the ferroelectric layer 15a consisting of $PbZr_{0.2}Ti_{0.8}Nb_{0.2}O_3$ (PZTN) is to be formed by using the first, second and third raw material liquids, they are mixed in a mixing ratio ((the first raw material liquid):(the second raw material liquid):(the third raw material liquid)) of 2:6:2. However, a high crystallization temperature would be required to form the PZTN ferroelectric layer 15a if the mixed solution is crystallized as it is. More specifically, the addition of Nb abruptly increases the crystallization temperature, making crystallization impossible in the temperature range that enables creation of devices below 700° C. Therefore, conventionally, Nb in the amount of 5 mol % or greater has not been used as a replacement element for Ti, and Nb is limited to the use only as an additive. In addition, there have been no cases of PZT tetragonal crystals in which Ti is contained in an amount greater than Zr. This is obvious from reference documents, such as, J. Am, Ceram. Soc, 84 (2001) 902 and Phys. Rev. Let, 83 (1999) 1347.

Accordingly, in the present embodiment, in order to solve the above-described problem, a solution in which a condensation polymer for forming $PbSiO_3$ crystal is dissolved in a solvent such as n-buthanol in an anhydrous state by 1 mol % or greater but less than 5 mol% can be added as a fourth raw material liquid to the above-described mixed solution.

In other words, by using the mixed solution of the first, second, third and fourth liquids, the crystallization temperature of PZTN can be lowered, and the PZTN can be crystallized in a temperature range in which devices can be created below 700° C.

Figure 2:
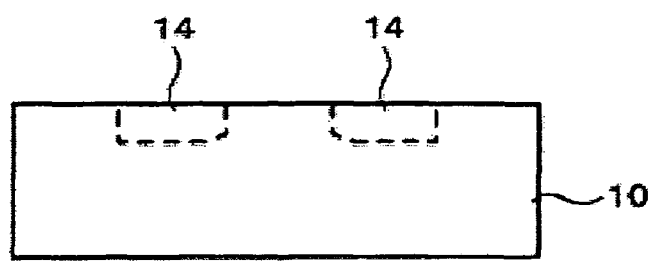
FIGS. 2(A)-(E) show cross-sectional views showing an example of a method for manufacturing an MFS type field effect transistor in accordance with an embodiment.
Figure 2:
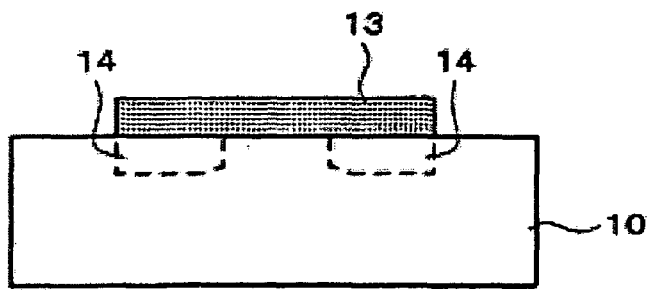
Figure 2:
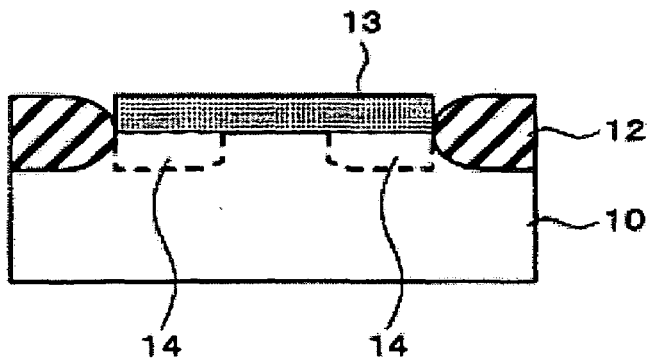
Figure 2:
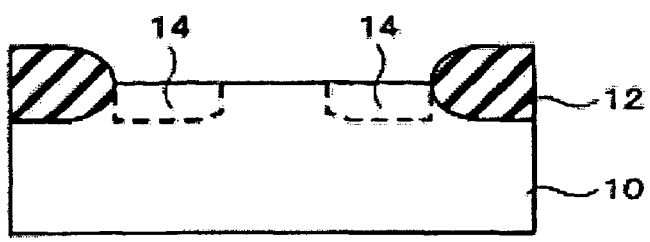
Figure 2:
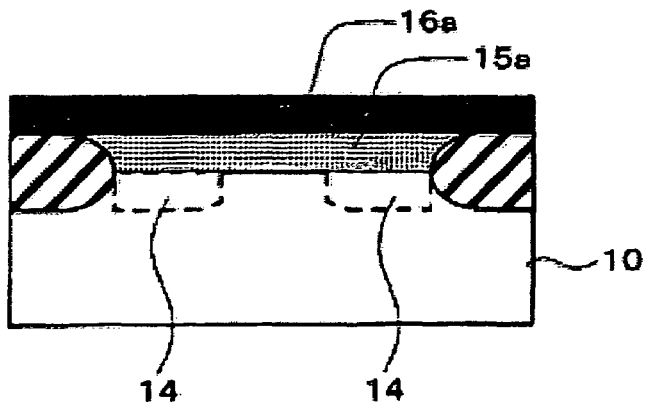

More specifically, the ferroelectric layer 15a is formed according to a flow chart shown in FIG. 2. A series of steps consisting of a mixed solution coating step (step ST11), an alcohol removal step, a dry thermal treatment step, and a cleaning thermal treatment step (step ST12, step ST13) is conducted a desired number of times, and then a sintering step is conducted for crystallization annealing (step ST14) to form the ferroelectric layer 15a.

Examples of the conditions in each of the steps of forming the ferroelectric layer 15a and the electrode layer 16a are given below.

First, the mixed liquid described above is coated on the semiconductor layer 10 by a coating method such as spin coating (step ST11). More specifically, the mixed solution is dripped on the semiconductor layer 10. In order to spread the dripped solution over the entire semiconductor layer surface, the semiconductor layer is rotated at about 500 rpm, then the rotation speed is reduced to 50 rpm or below, and it is rotated for about 10 seconds. The dry thermal treatment step is conducted at 150° C.-180° C. (step ST13). The dry thermal treatment step is conducted by using a hot-plate or the like in the air atmosphere. Similarly, the cleaning thermal treatment step is conducted in the air atmosphere using a hot-plate, which is held at 300° C.-350° C. (step ST13). The sintering step for crystallization is conducted by using rapid thermal annealing (RTA) or the like in an oxygen atmosphere (step ST14).

The film thickness after sintering can be about 100-200 nm. After an electrode layer 16a for a gate electrode has been formed by sputtering or the like (step ST15), post-annealing is conducted for the purpose of forming an interface between the gate electrode and the ferroelectric layer and improving the crystallinity of the ferroelectric layer, using RTA or the like in an oxygen atmosphere (step ST16) in a manner similar to the sintering step. Through the steps described above, films of the ferroelectric layer 15a and the electrode layer 16a shown in FIG. 2(E) are formed.

Then, as shown in FIG. 1, the ferroelectric layer 15a and the electrode layer 16a are patterned by using lithography and etching techniques, thereby forming a ferroelectric layer 15 and a gate electrode 16.

Then, an interlayer dielectric layer and a wiring layer are formed by using a known technology for manufacturing a semiconductor device, whereby a MFS type field effect transistor 100 in accordance with the present embodiment can be formed.

Embodiment Examples of the present embodiment are described in detail below.

EMBODIMENT EXAMPLE 1

Figure 3:
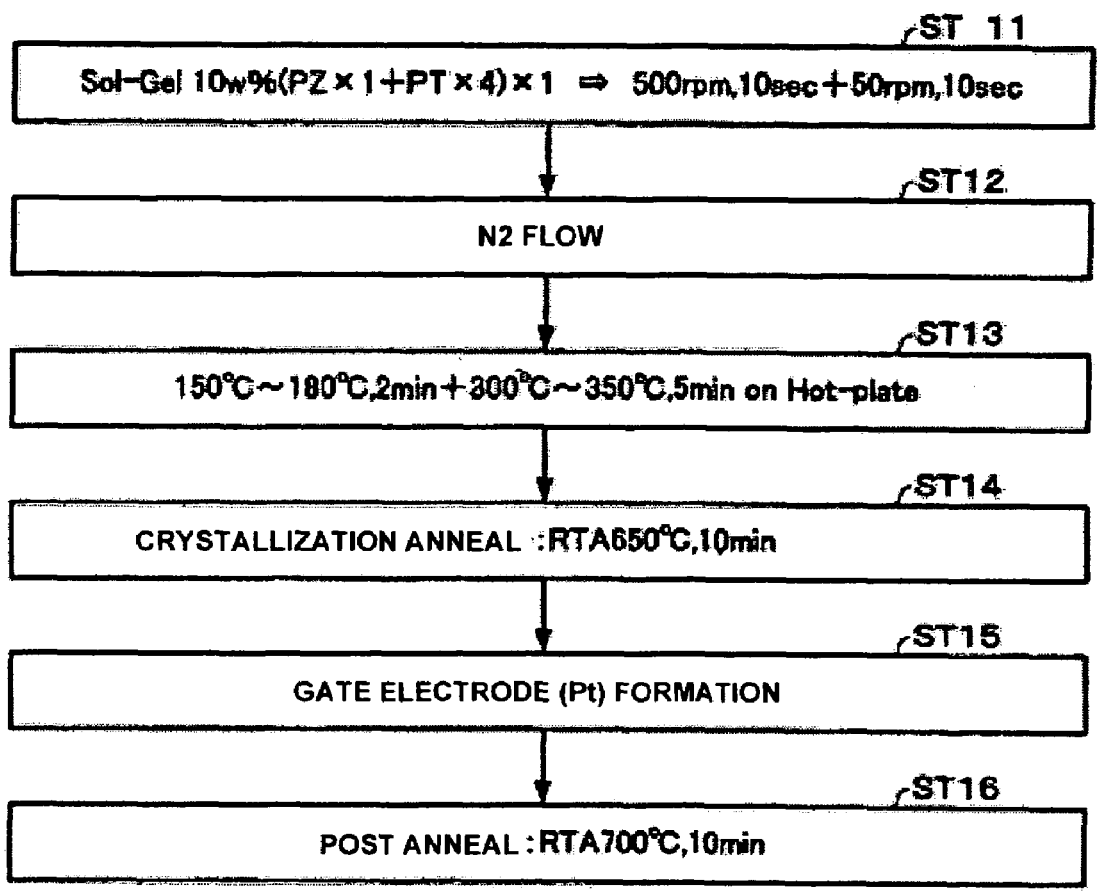
FIG. 3 shows a flow chart of forming a PZTN film by a spin coat method in accordance with an embodiment.

In the present embodiment example, PZTN to be used in the present invention and conventional PZT are compared. The film forming was conducted according to the process flow shown in FIG. 3 described above. Also, in the present embodiment example, a step of forming a lower electrode of platinum on the substrate was added before step ST11.

Ratios of Pb:Zr:Ti:Nb at 1:0.2:0.6:0.2, 1:0.2:0.7:0.1, and 1:0.3:0.65:0.5 were used. In other words, the amount of Nb added was 5-20 mol % with respect to the total amount. In this examples, $PbSiO_3$ was added by 0-1%.

Figure 4:
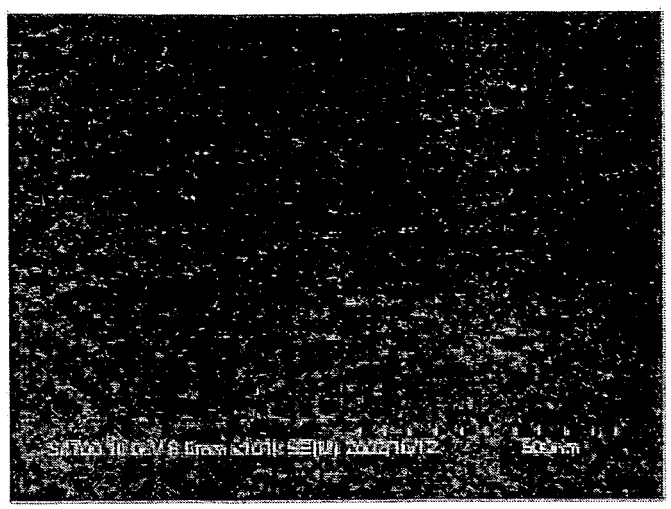
FIGS. 4(A)-(C) show surface morphologies of PZTN films in accordance with Embodiment Example 1 of the present embodiment.
Figure 4:
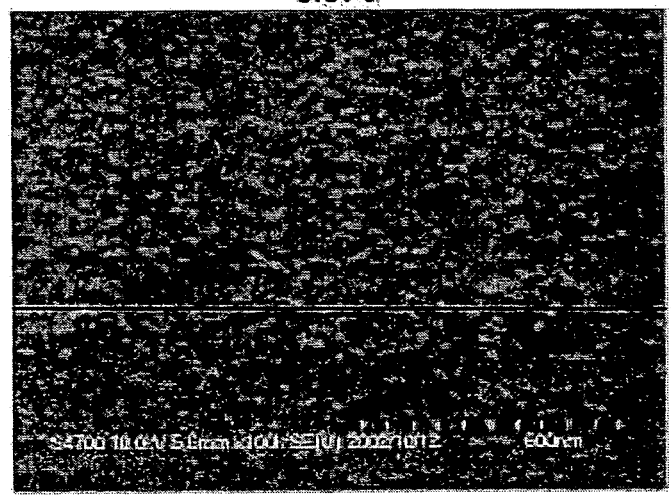
Figure 4:
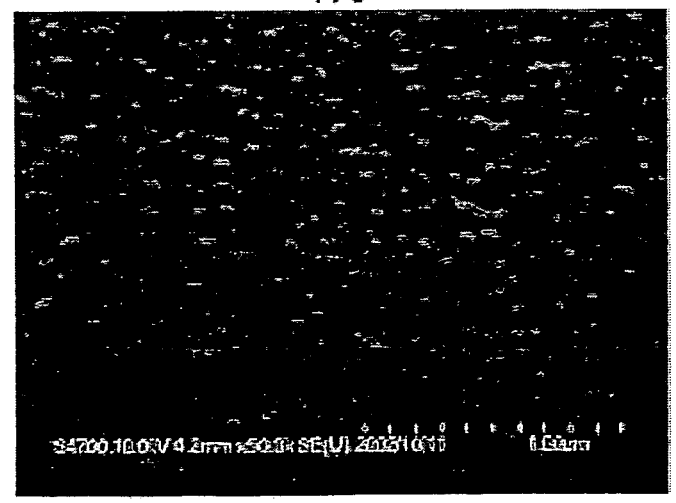
Figure 5:
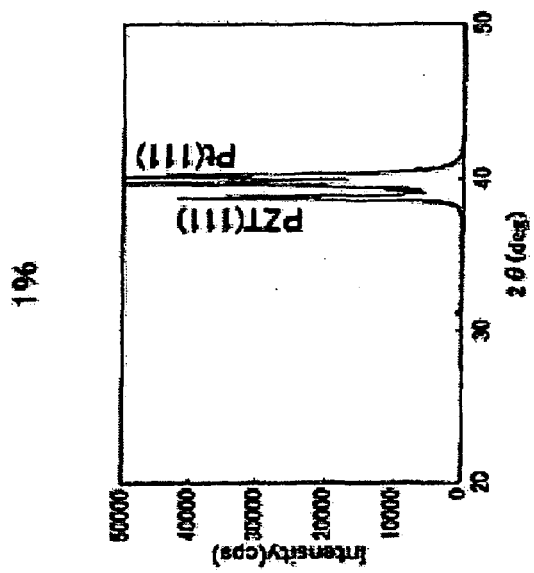
FIGS. 5(A)-(C) show crystallinity of PZTN films in accordance with Embodiment Example 1 of the present embodiment.
Figure 5:
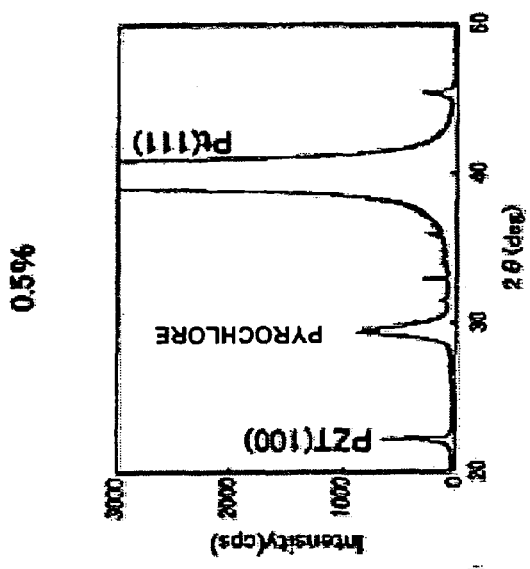
Figure 5:
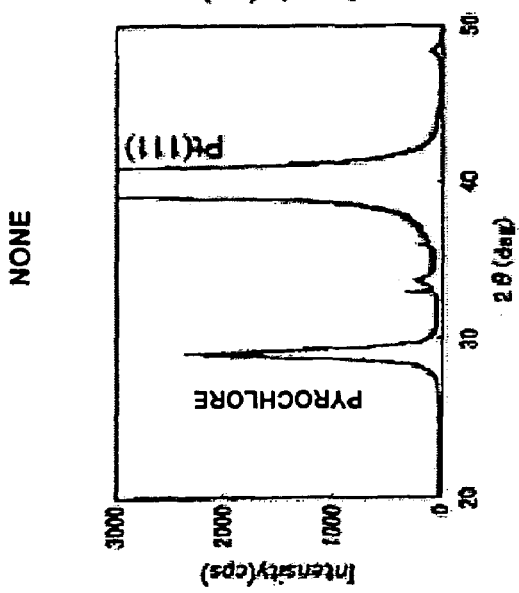

Surface morphologies of the films obtained are shown in FIGS. 4(A)-4(C). Also, the crystallinity of the films was measured by an X-ray diffraction method, and the results shown in FIGS. 5(A)-5(C) were obtained. In the case of 0% (none) shown in FIG. 5 (A), paraelectric pyrochlore alone was obtained even when the crystallization temperature was raised to 800° C. In the case of 0.5% shown in FIG. 5(B), PZT and pyrochlore were present in a mixed state. Also, in the case of 1% shown in FIG. 5(C), a single oriented film of PZT (111) was obtained, and its crystallinity was excellent to a level that had never been achieved.

Figure 6:
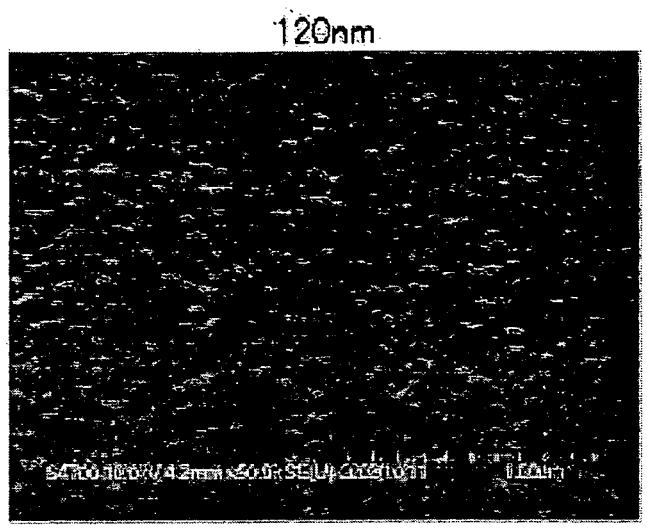
FIGS. 6(A)-(C) show the relationship between film thickness and surface morphology of PZTN films in accordance with Embodiment Example 1 of the present embodiment.
Figure 6:
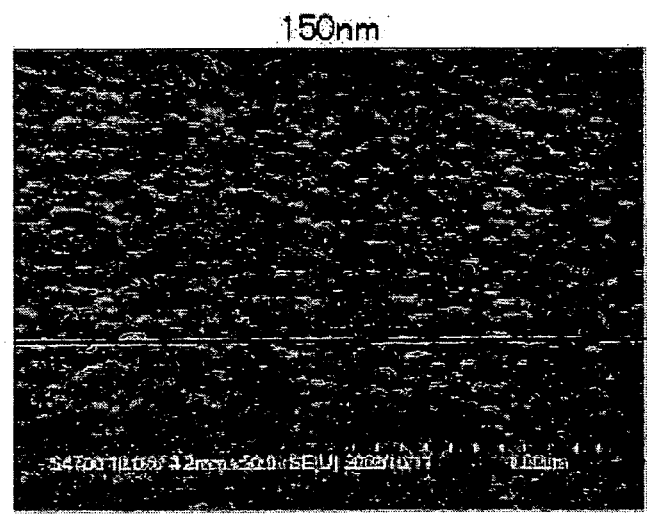
Figure 6:
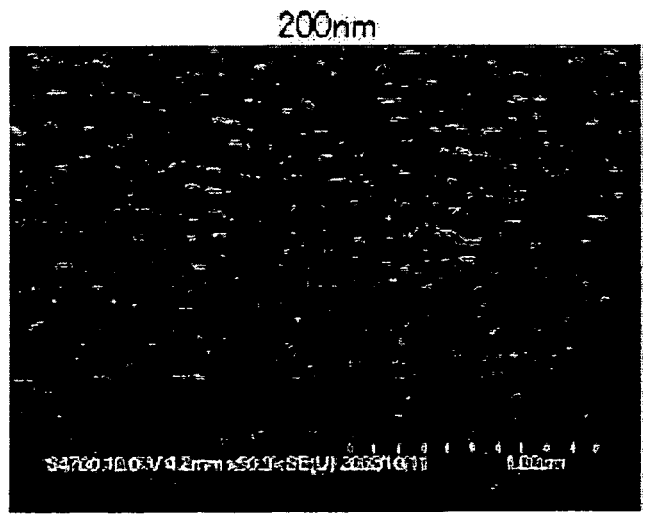
Figure 7:
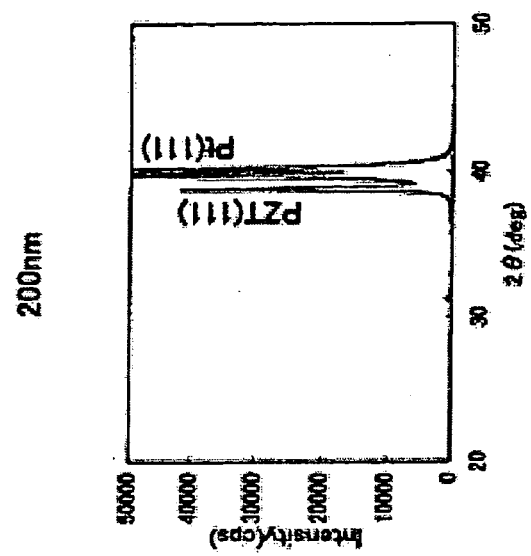
FIGS. 7(A)-(C) show the relationship between film thickness and crystallinity of PZTN films in accordance with Embodiment Example 1 of the present embodiment.
Figure 7:
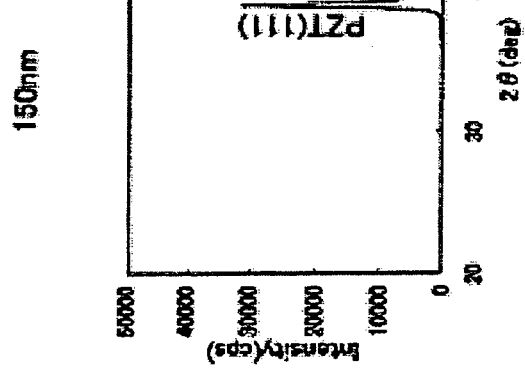
Figure 7:
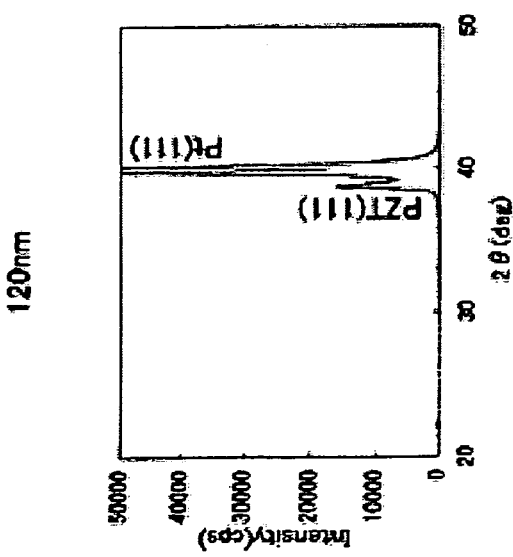
Figure 8:
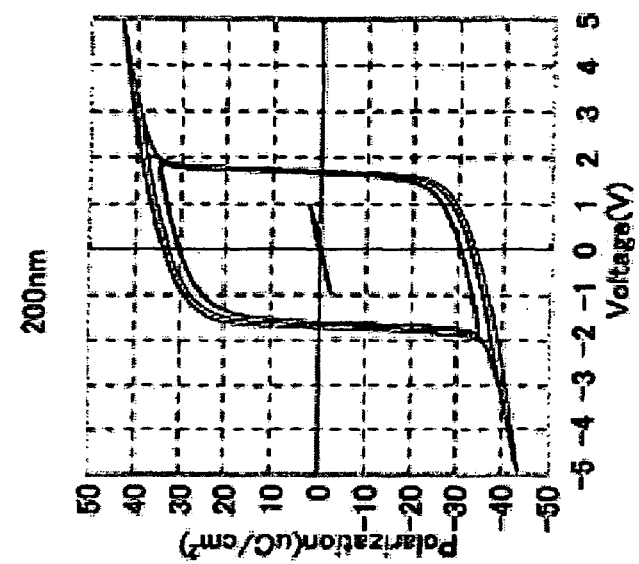
FIGS. 8(A)-(C) show the relationship between film thickness and hysteresis characteristics of PZTN films in accordance with Embodiment Example 1 of the present embodiment.
Figure 8:
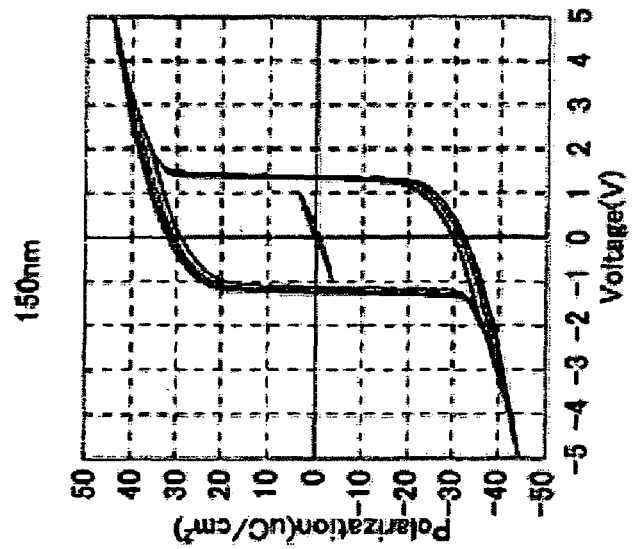
Figure 8:
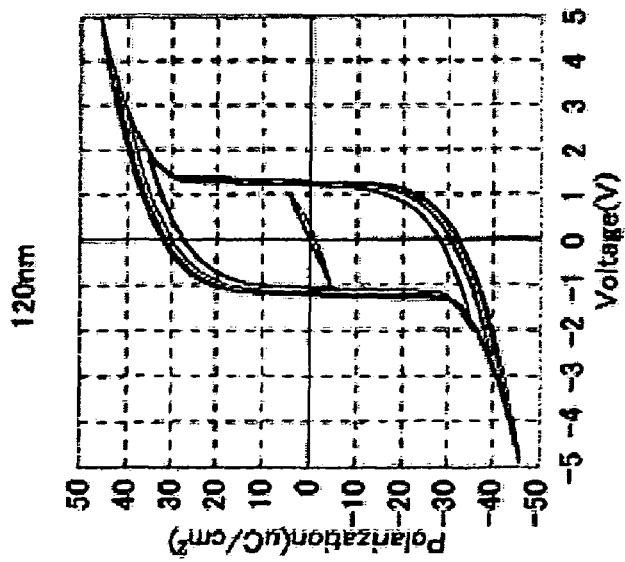
Figure 9:
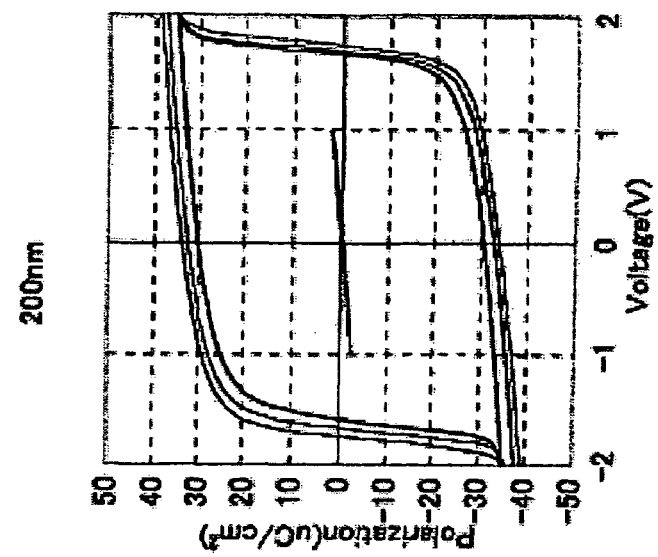
FIGS. 9(A)-(C) show the relationship between film thickness and hysteresis characteristics of PZTN films in accordance with Embodiment Example 1 of the present embodiment.
Figure 9:
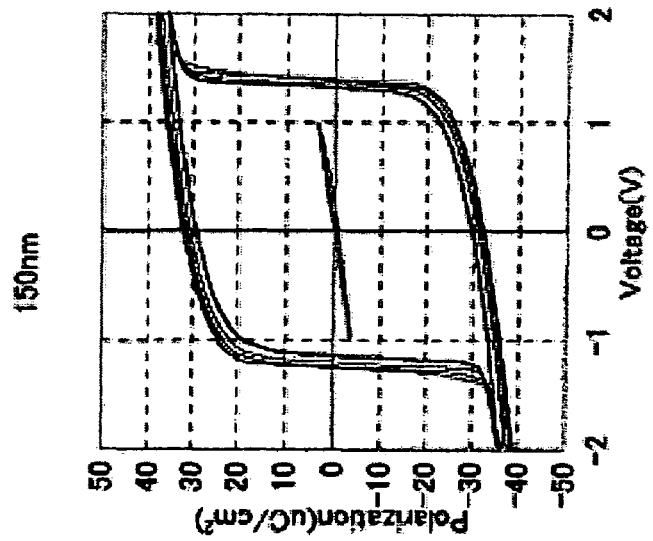
Figure 9:
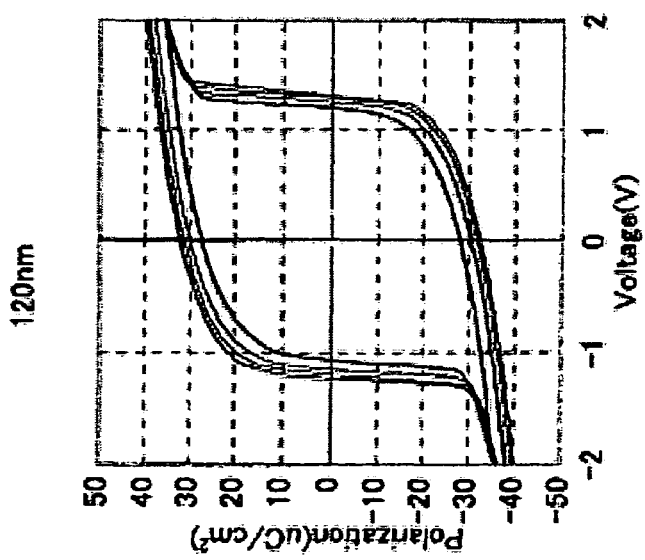

Next, the PZTN thin films in which $PbSiO_3$ added by 1% were formed in different film thickness ranging from 120 nm to 200 nm. As shown in FIGS. 6(A) to 6(C) and FIGS. 7(A) to 7(C), the levels of crystallinity proportional to the respective film thicknesses were exhibited. It is noted that FIGS. 6(A) to 6(C) are electron micrographs showing the surface morphologies for the film thicknesses ranging from 120 nm to 200 nm, and FIGS. 7(A) to 7(C) show the results of measurements conducted by an X-ray diffraction method showing the crystallinity of PZTN thin films of film thicknesses ranging from 120 nm to 200 nm. As shown in FIGS. 8(A) to 8(C) and FIGS. 9(A) to 9(C), hysteresis characteristics with good squareness were obtained over the entire range of film thickness of 120 nm to 200 nm. It is noted that FIGS. 9(A) to 9(C) are enlarged views of the hysteresis curves of FIGS. 8(A) to 8(C). In particular, as shown in FIGS. 9(A) to 9(C), it was confirmed that the hysteresis curves clearly opened up and also reached saturation at low voltages at 2 V or less, in the ZPTN thin films of the present examples.

Figure 10:
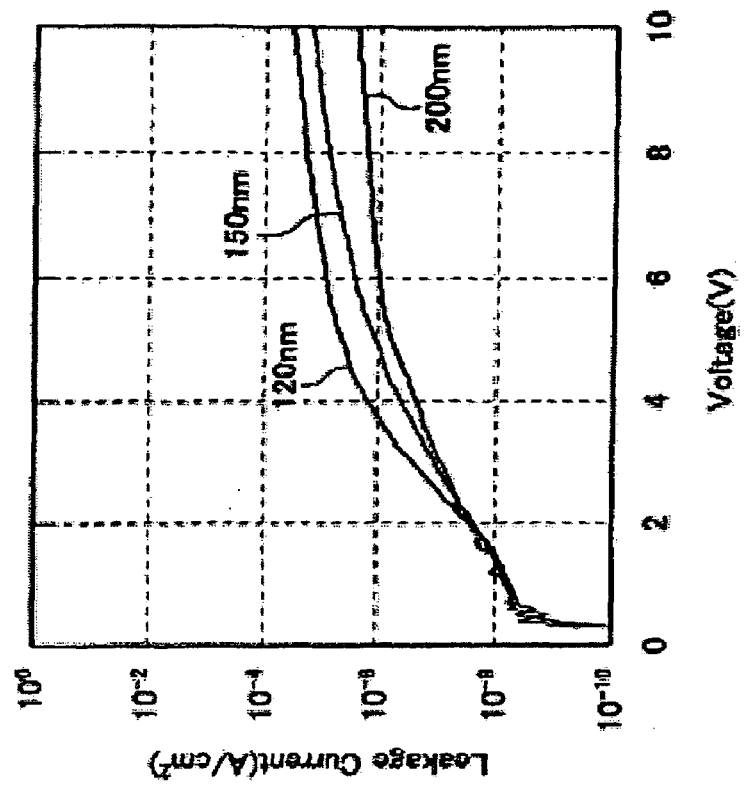
FIGS. 10(A) and (B) show the leakage current characteristics of PZTN films in accordance with Embodiment Example 1 of the present embodiment.
Figure 10:
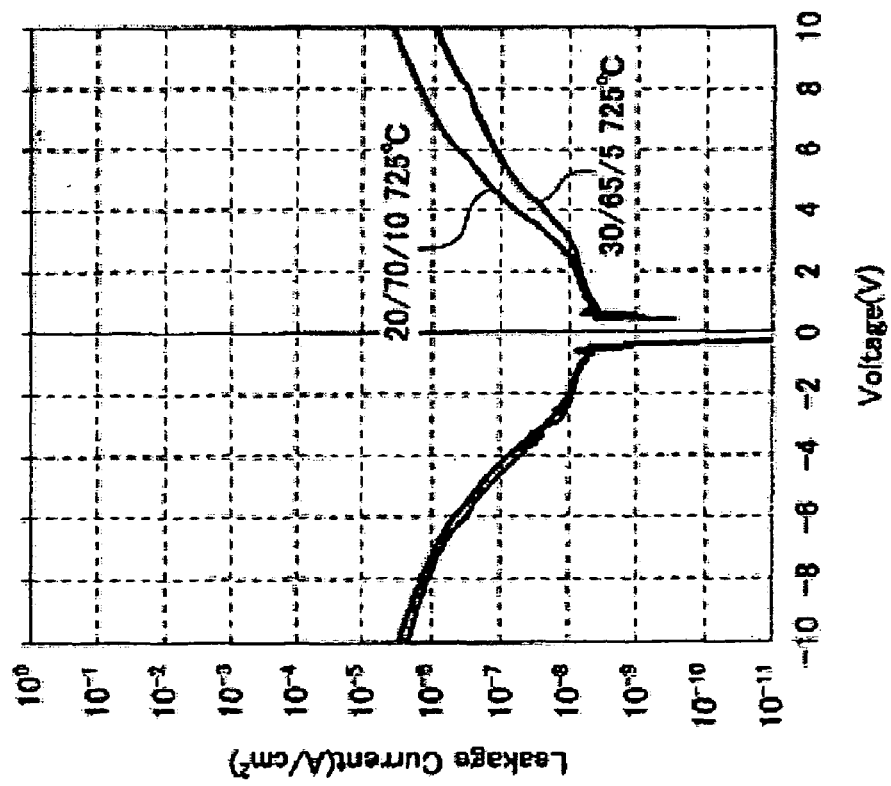

The leakage characteristics were also very good at $5 \times 10^{-8}$ to $7 \times 10^{-9}$ $A/cm^2$ when 2 V (saturation) was applied thereto, regardless of the film composition and film thickness, as shown in FIGS. 10(A) and 10(B).

Figure 11:
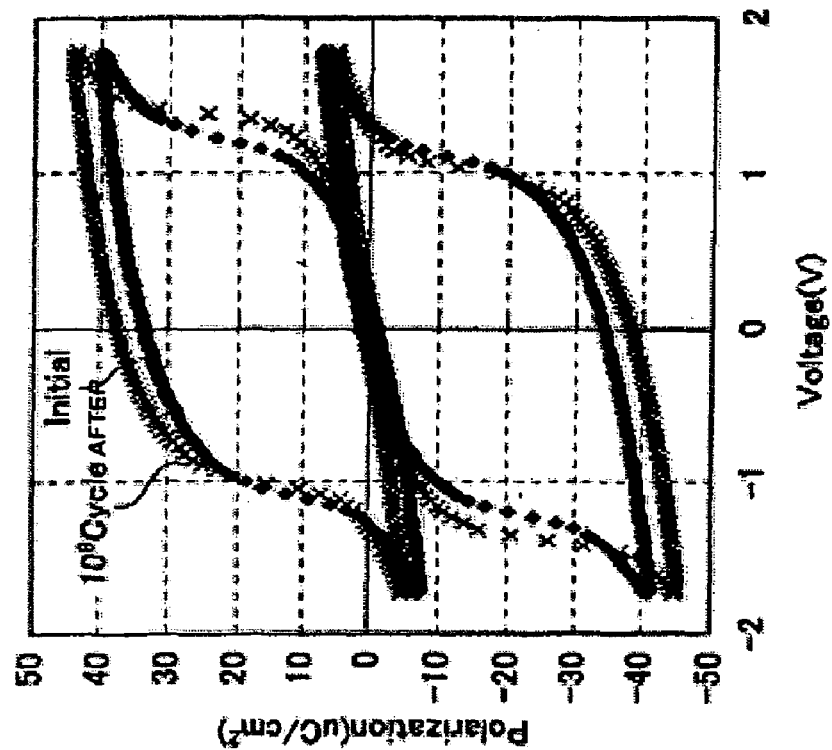
FIGS. 11(A) and (B) show the fatigue characteristic and the static imprint characteristic of a PZTN film in accordance with Embodiment Example 1 of the present embodiment.
Figure 11:
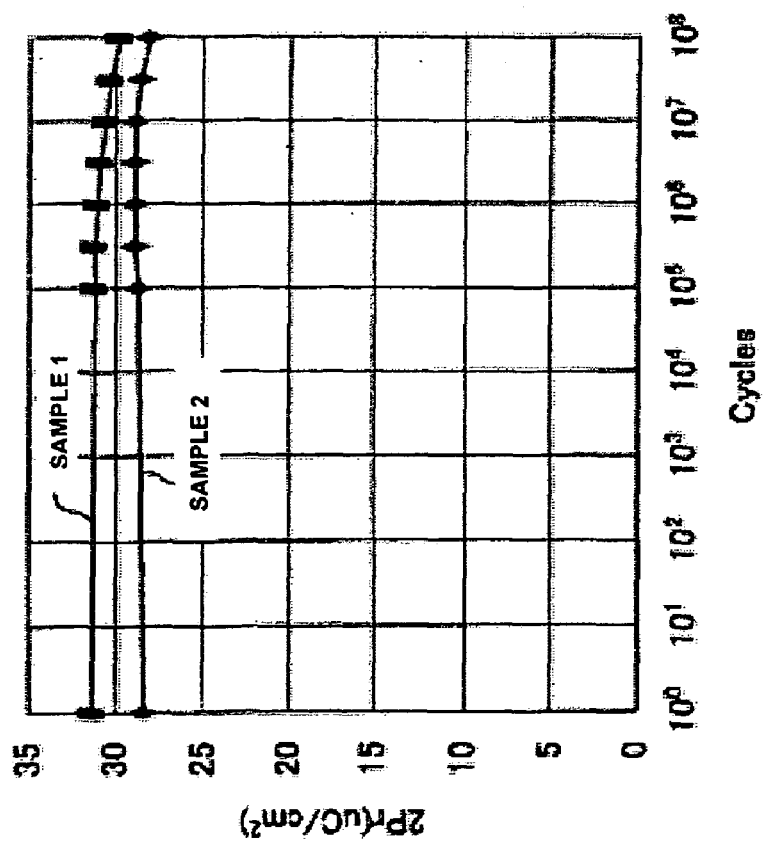

The fatigue characteristic and static imprinting of $PbZr_{0.2}Ti_{0.8}Nb_{0.2}$ thin films were measured, and the results of measurements were also good, as shown in FIGS. 11(A) and 11(B). In particular, the fatigue characteristic shown in FIG. 11(A) is excellent, despite that Pt was used in the upper and lower electrodes.

Figure 12:
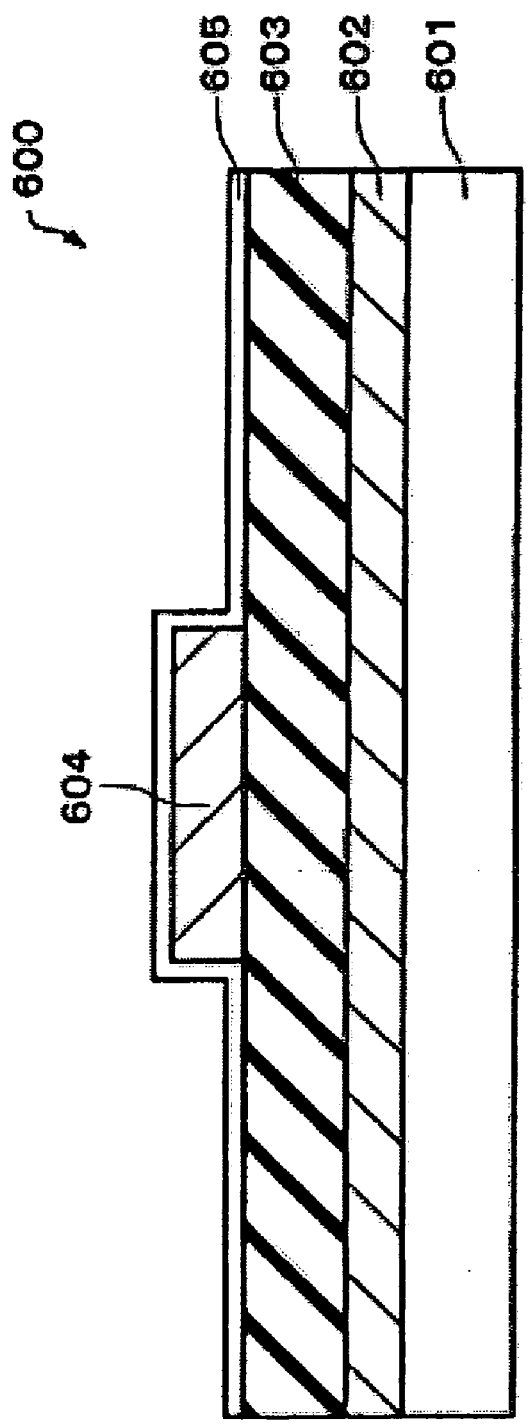
FIG. 12 shows the configuration of a capacitor in accordance with Embodiment Example 1 of the present embodiment in which a $SiO_2$ protective film is formed by ozone TEOS.

Further, as shown in FIG. 12, attempts were made to form an $SiO_2$ film 604 with ozone TEOS on a ferroelectric capacitor 600 in which a lower electrode 602, a PZTN ferroelectric film 603 of the present embodiment example, and an upper electrode 604 are formed over a substrate 601. It is known in the art that, if a $SiO_2$ film is formed with ozone TEOS on PZT, hydrogen generated from the TEOS penetrates the upper Pt and reduces the PZT, such that the PZT crystal is destroyed to the extent that the hysteresis phenomenon does not occur.

Figure 13:
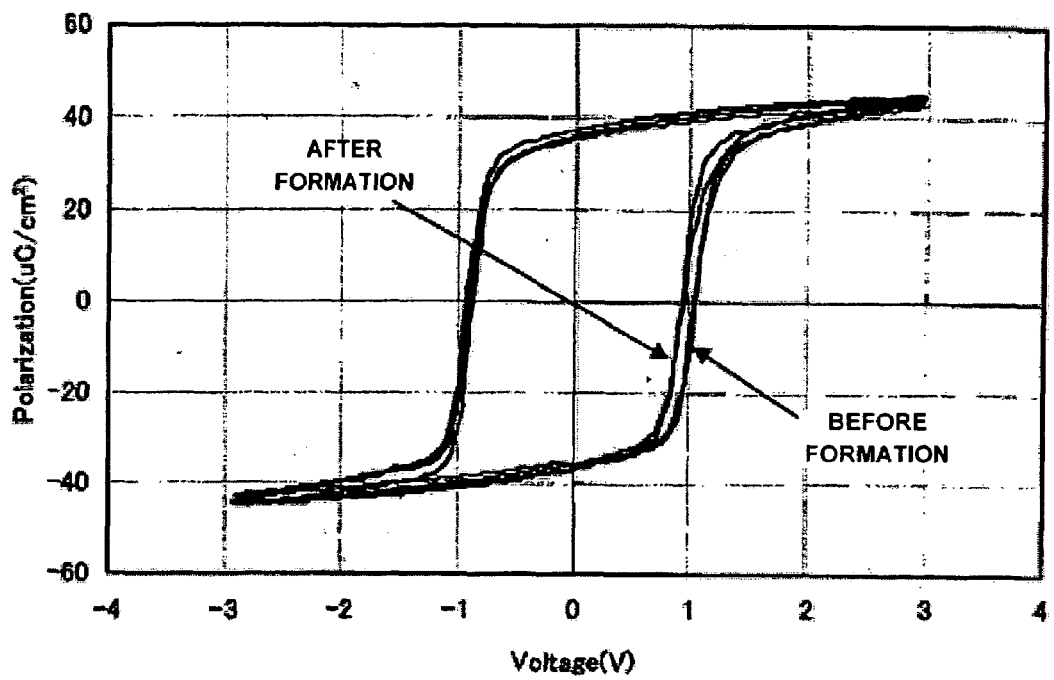
FIG. 13 shows the hysteresis characteristic of the capacitor in accordance with Embodiment Example 1 of the present embodiment after the $SiO_2$ protective film is formed by ozone TEOS.
Figure 14:
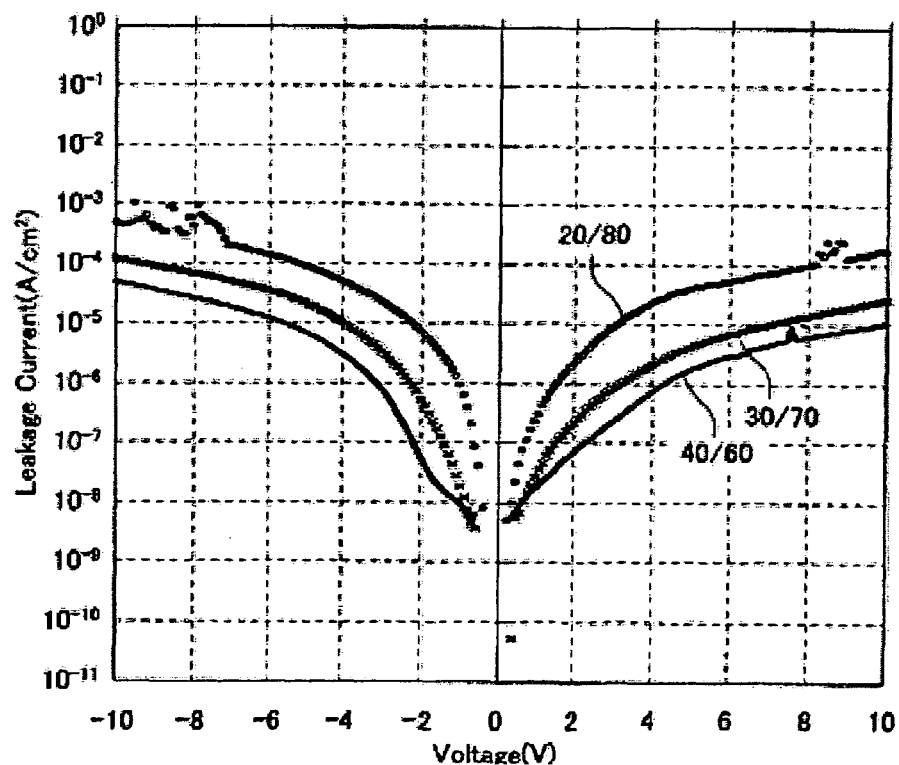
FIG. 14 show the leakage current characteristics of conventional PZT films considered in Embodiment Example 1 of the present embodiment.
Figure 15:
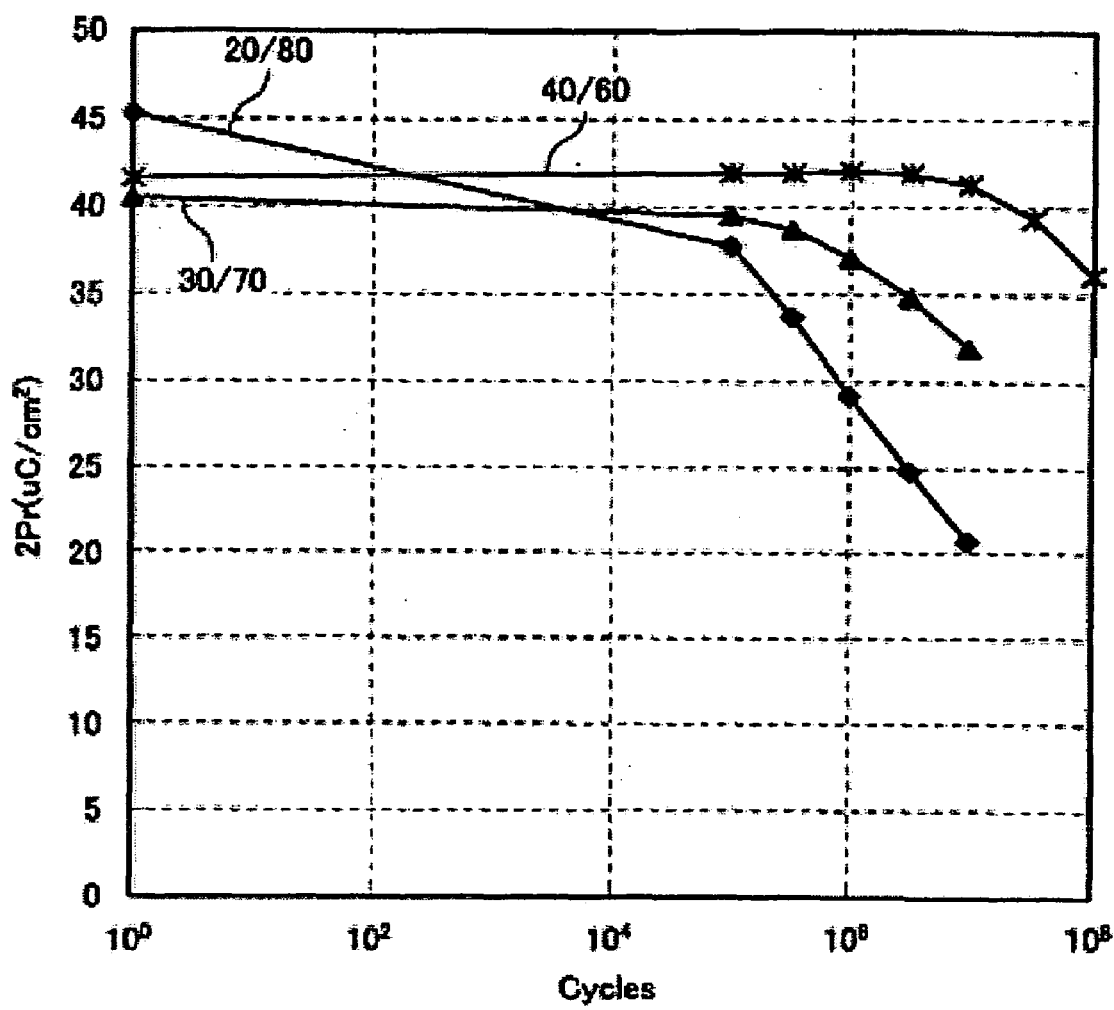
FIG. 15 shows the fatigue characteristics of conventional PZT capacitors considered in Embodiment Example 1 of the present embodiment.
Figure 16:
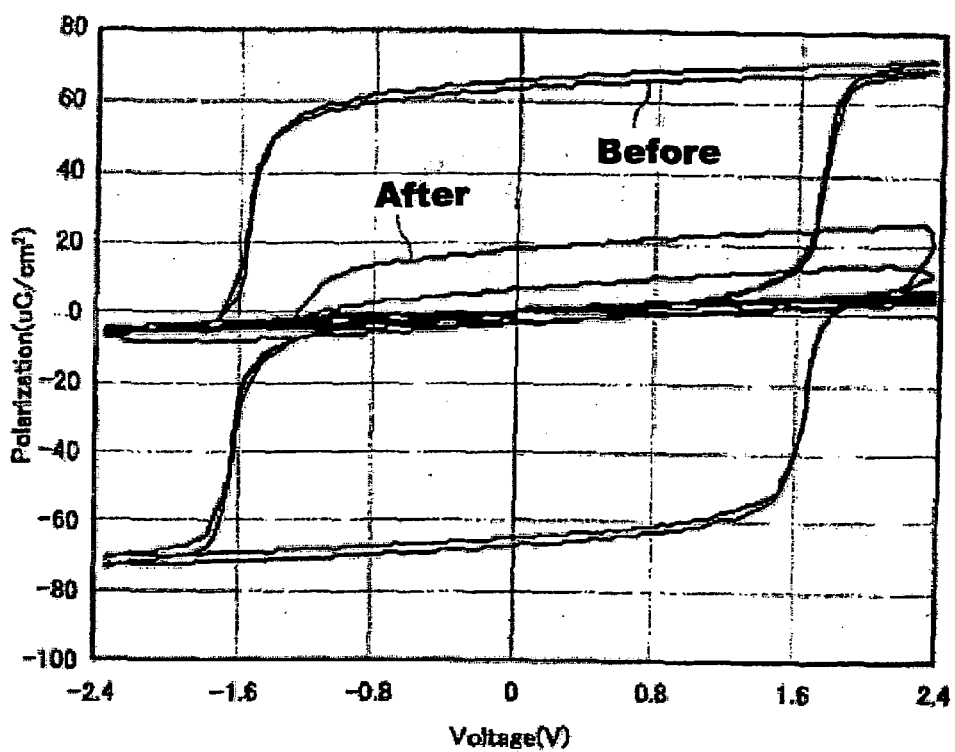
FIG. 16 shows the static imprint characteristics of conventional PZT capacitors considered in Embodiment Example 1 of the present embodiment.

With the PZTN ferroelectric layer 603 of the present embodiment example, however, favorable hysteresis is maintained with substantially no deterioration, as shown in FIG. 13. In other words, it is found that the PZTN ferroelectric layer 603 of the present embodiment also has a strong resistance to reduction. If the ratio of Nb in the tetragonal PZTN ferroelectric layer 603 of the present invention does not exceed 40 mol %, favorable hysteresis is obtained in proportion to the quantity of Nb added Evaluation of conventional PZT ferroelectric layers was conducted for comparison. The conventional PZT samples had Pb:Zr:Ti ratios of 1:0.2:0.8, 1:0.3:0.7, and 1:0.6:0.4. The leakage characteristics thereof were such that the leakage characteristics deteriorated with increasing Ti content, as shown in FIG. 14, so that it was found that when Ti was 80% and 2 V was applied, the characteristic was $10^{-5}$ A/cm$^2$, making it unsuitable for memory applications. Similarly, the fatigue characteristic deteriorated with increasing Ti content, as shown in FIG. 15. After imprinting, it was found that the data could hardly be read out, as indicated in FIG. 16.

As is clear from the above-described embodiment example, the PZTN ferroelectric film in accordance with the present embodiment not only solved the problem of the increases leakage current and the deterioration in the imprint characteristic, which were thought to be intrinsic to PZT in the conventional art, but also made it possible to use tetragonal PZT, which had not been used for the reasons described above, in memory applications without concern of memory type or configuration. In addition, the material of the present embodiment can also be used in piezoelectric element applications in which tetragonal PZT could not be used before for the same reason.

EMBODIMENT EXAMPLE 2

The present embodiment example compares the ferroelectric characteristics obtained when the amount of Nb added to the PZTN ferroelectric layer used in the present invention was varied from 0, 5, 10, 20, 30 to 40 mol %. PbSiO$_3$ silicate was added by 5 mol % to all of the test pieces. In addition, methyl succinate was added to the sol-gel solutions for forming the ferroelectric films, which includes raw materials for film formation, to adjust the pH to 6. The entire film forming flow shown in FIG. 3 was used therefore. Also, in the present embodiment example, for forming a capacitor, the step of forming a lower electrode of platinum over the substrate was added before the step ST11.

Figure 19:
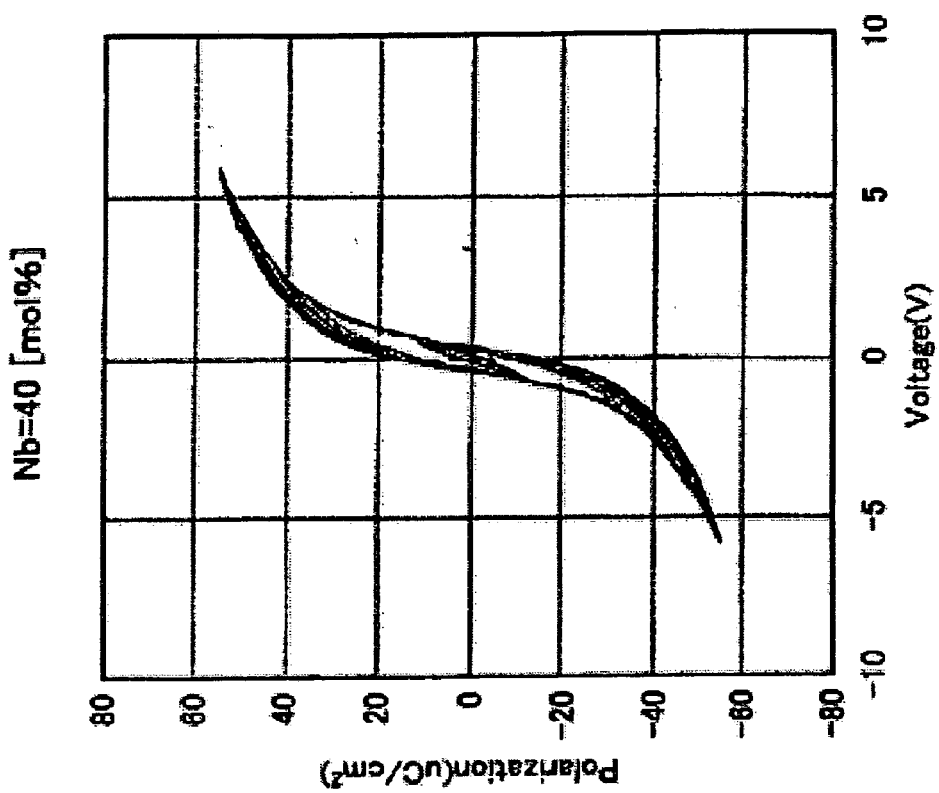
FIGS. 19(A) and (B) show the hysteresis characteristics of PZTN films in accordance with Embodiment Example 2 of the present embodiment.
Figure 19:
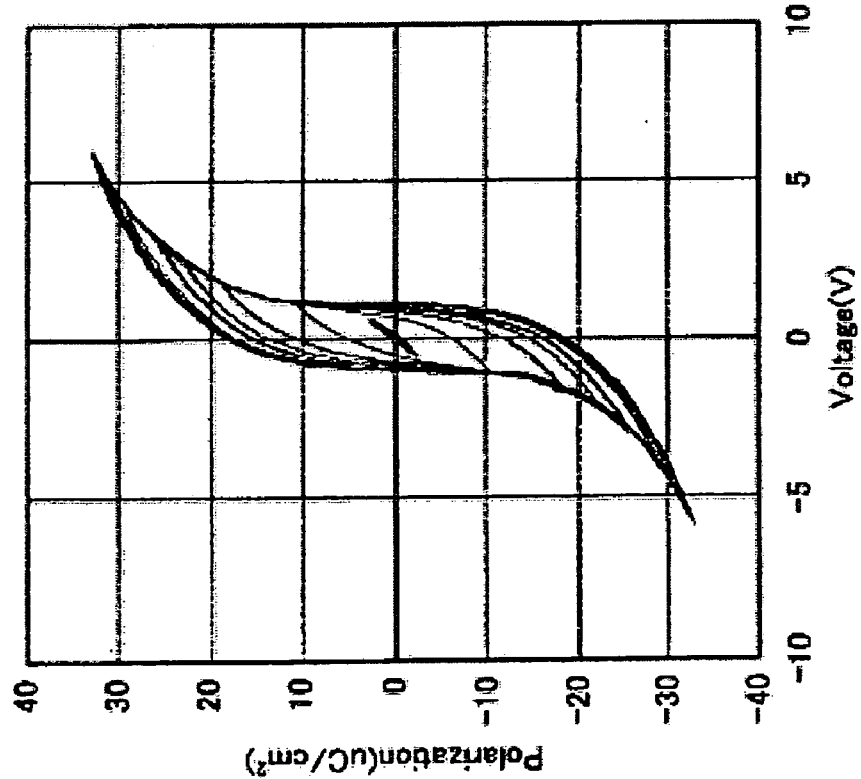

Measured hysteresis characteristics of PZTN ferroelectric films in accordance with the present embodiment example are shown in FIGS. 17 to 19.

As indicated in FIG. 17(A), when the amount of Nb added was 0, a leaky hysteresis was obtained, whereas, as indicated in FIG. 17(B), a good hysteresis characteristic with a high level of insulation was obtained when the amount of Nb added was 5 mol %.

Also, as indicated in FIG. 18(A), substantially no change was observed in the ferroelectric characteristic until the amount of Nb added reached 10 mol %. Even when the amount of Nb added was 0, no change was observed in the ferroelectric characteristic, thought it was leaky. When the amount of Nb added was 20 mol %, a hysteresis characteristic with an excellent squareness was obtained, as indicated in FIG. 18(B).

However, it was confirmed that when the amount of Nb added exceeded 20 mol %, the hysteresis characteristic greatly changed and became deteriorated, as indicated in FIGS. 19(A) and 19(B).

Figure 20:
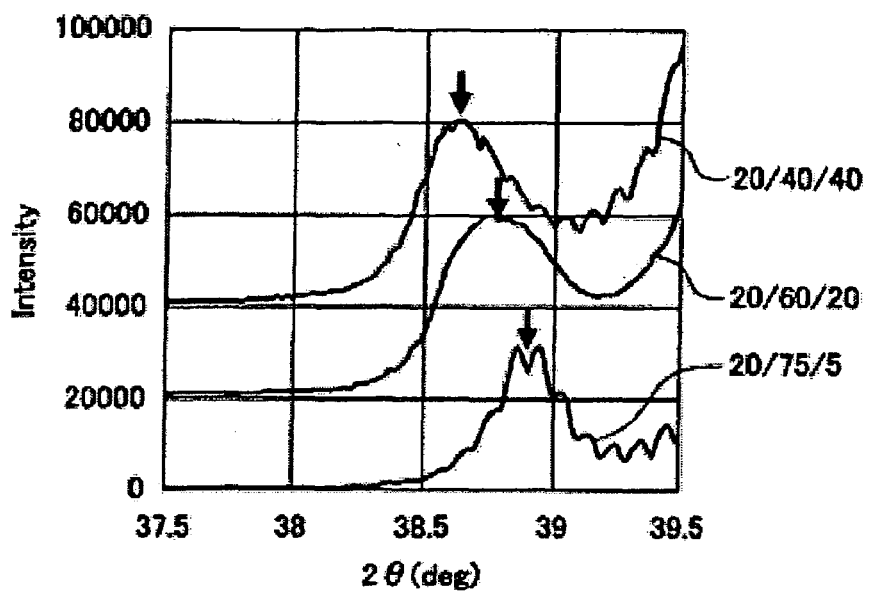
FIG. 20 shows X-ray diffraction patterns of PZTN films in accordance with Embodiment Example 2 of the present embodiment.

Then, X-ray diffraction patterns were compared, as shown in FIG. 20. When the amount of Nb added was 5 mol % (Zr/Ti/Nb=20/75/5), the (111) peak position did not change from that of a PZT film of the conventional art in which no Nb is added, but the (111) peak shifted towards a lower angle side as the amount of Nb added was increased to 20 mol % (Zr/Ti/Nb=20/60/20) and 40 mol % (Zr/Ti/Nb=20/40/40). In other words, it was found that the actual crystal was rhombohedral, although the PZT composition was Ti-rich and in a tetragonal region. It was also observed that the ferroelectric characteristics changed as the crystal system changed.

In addition, when the amount of Nb added reached 45 mol %, a sufficient hysteresis did not open and it was not possible to confirm ferroelectric characteristics (not shown).

Figure 21:
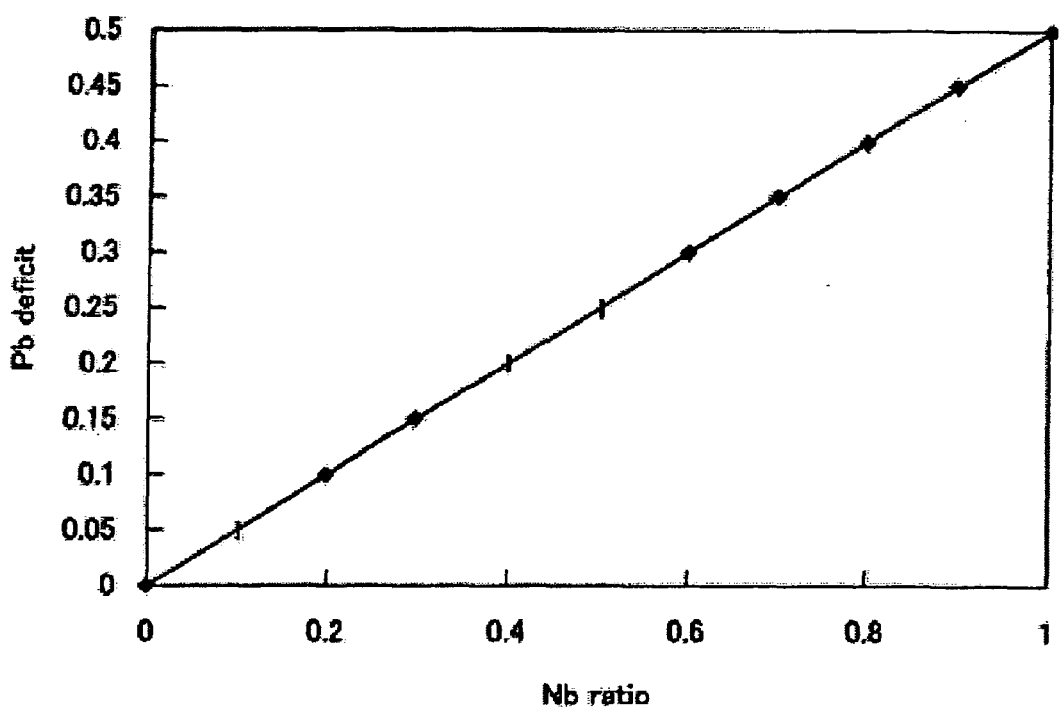
FIG. 21 shows the relationship between Pb vacancies and Nb composition ratios in a PZTN crystal in accordance with Embodiment Example 2 of the present embodiment.

PZTN films of the present invention have a very high level of insulation property, as already mentioned above. In this respect, conditions for PZTN to be dielectric were obtained, and the results shown FIG. 21 were obtained.

Figure 22:
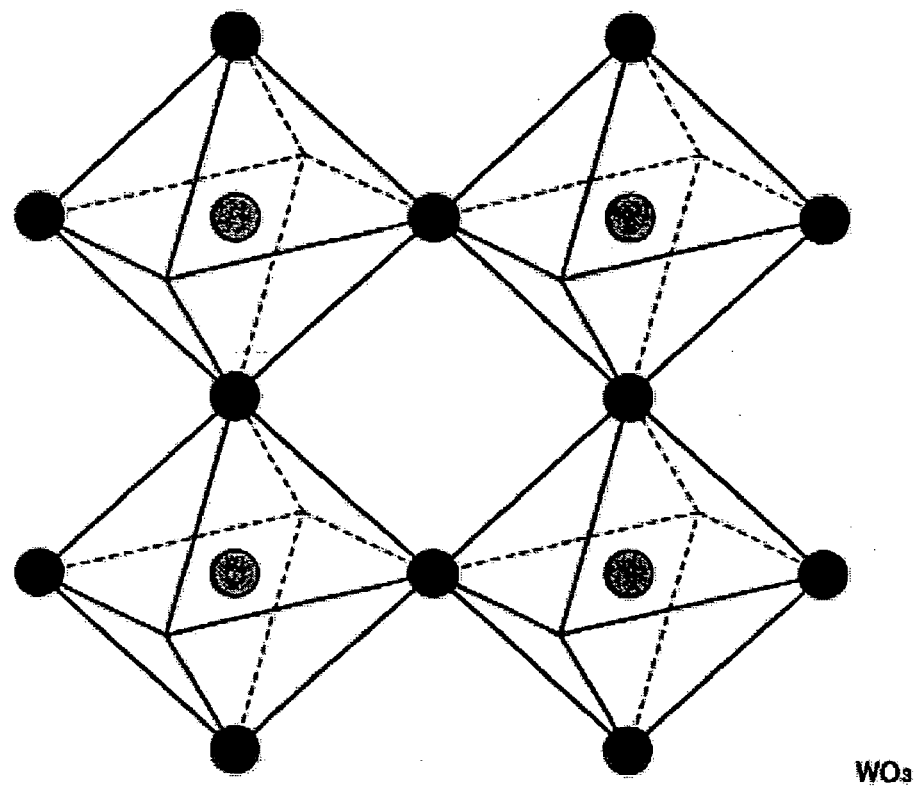
FIG. 22 shows a diagram for describing the $WO_3$ crystal structure that is a perovskite crystal.

That is, the PZTN of the present invention has a very high level of insulation property, which means that Nb is added to Ti sites in a composition ratio equivalent to twice the amount of vacancies of Pb. Also, a perovskite crystal can be established even when 100% of A site ions are vacated, as understood from the crystal structure of WO$_3$ shown in FIG. 22, and it is known that the crystal system of WO$_3$ would readily change.

Accordingly, with PZTN, the addition of Nb enables active control of Pb vacancy, and also controls the crystal system.

This shows that the PZTN of the present embodiment would be very useful when applied to piezoelectric elements. In general, when PZT is applied to piezoelectric elements, a rhombohedral crystal region with a Zr-rich composition is used. In this case, Zr-rich PZT is called soft PZT. This literally means that the crystal is soft. For example, when soft PZT is used in a nozzle that ejects ink in an inkjet printer, ink having a high viscosity cannot be pushed out because soft PZT is too soft and gives way to pressure of the ink.

Ti-rich tetragonal PZT, on the other hand, is called hard PZT, which means to be hard and brittle. While the PZTN film of the present invention is hard, the crystal system can be artificially changed into rhombohedral. In addition, the crystal system can be arbitrarily changed by the amount of Nb to be added and a Ti-rich PZT-system ferroelectric layer has a small relative dielectric constant, such that devices can be driven at a low voltage.

This makes it possible to use hard PZT in applications where it could not be used previously, such as, in ink ejection nozzles of an inkjet printer. In addition, since Nb makes PZT softer, it is possible to provide PZT that is adequately hard, but not brittle.

Lastly, as described above, in accordance with the present embodiment example, not only Nb but also a silicate may be added at the same time with the addition of Nb, whereby the crystallization temperature can be reduced.

EMBODIMENT EXAMPLE 3

This embodiment example investigates the validity of using a PZTN film from the viewpoint of lattice matching, for example, when the PZTN film is formed on a metal film composed of a platinum-system metal such as Pt, Ir or the like as an electrode material for a ferroelectric capacitor that forms a memory cell portion of a ferroelectric memory or a piezoelectric actuator that composes an ink ejection nozzle portion of an inkjet printer. Platinum-system metals act as underlayer films that determine the crystal orientation of ferroelectric films, and are also useful as electrode materials. However, since the lattice matching of the two materials are not sufficient, there may be a problem concerning fatigue characteristics of ferroelectric films when applied to devices.

In this case, the present inventors have developed a technique designed to ameliorate lattice mismatches between a PZT-system ferroelectric layer and a platinum-system metal thin film, by incorporating Nb into the constituent elements of the PZT-system ferroelectric layer. The process of manufacturing this PZT-system ferroelectric film is shown in FIGS. 23(A) to 23(C).

Figure 23:
FIGS. 23(A)-(C) schematically show a process of forming a PZTN film in accordance with Embodiment Example 3 of the present embodiment.
Figure 23:
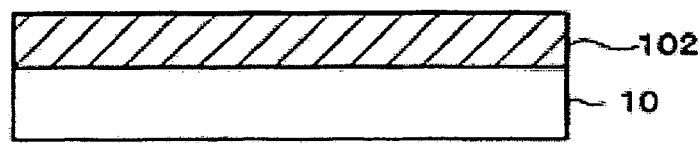
Figure 23:
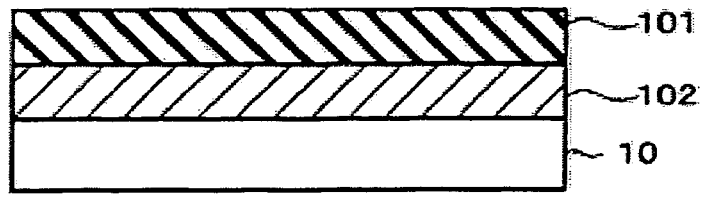

First, a given substrate 10 is prepared, as shown in FIG. 23 (A). A TiOx layer formed on an SOI substrate is used as the substrate 10. It is noted that a preferred material can be selected from known materials as the substrate 10.

Next, as shown in FIG. 23(B), a metal film (first electrode) 102 is formed by sputtering Pt, for example, on the substrate 11, and then a PZTN film is formed as a ferroelectric film 15 on the metal film 102, as shown in FIG. 23(C). Sol-gel solutions can be used as the materials for forming the PZTN film. More specifically, a mixture of a sol-gel solution for $PbZrO_3$, a sol-gel solution for $PbTiO_3$, and a sol-gel solution for $PbNbO_3$, with a sol-gel solution for $PbNbO_3$ added thereto is used. It is noted that because the PZTN film includes Nb as its constituent element, the crystallization temperature thereof is high. For that reason, it is preferable to further add a sol-gel solution for $PbSiO_3$ to the solution, to reduce the crystallization temperature. In the present embodiment example, the aforementioned sol-gel mixed solution is coated on the Pt metal film 102 by a spin-coat method, and then is subjected to a predetermined heat treatment to crystallize it. The film forming flow is similar to the one shown in FIG. 3.

Figure 24:
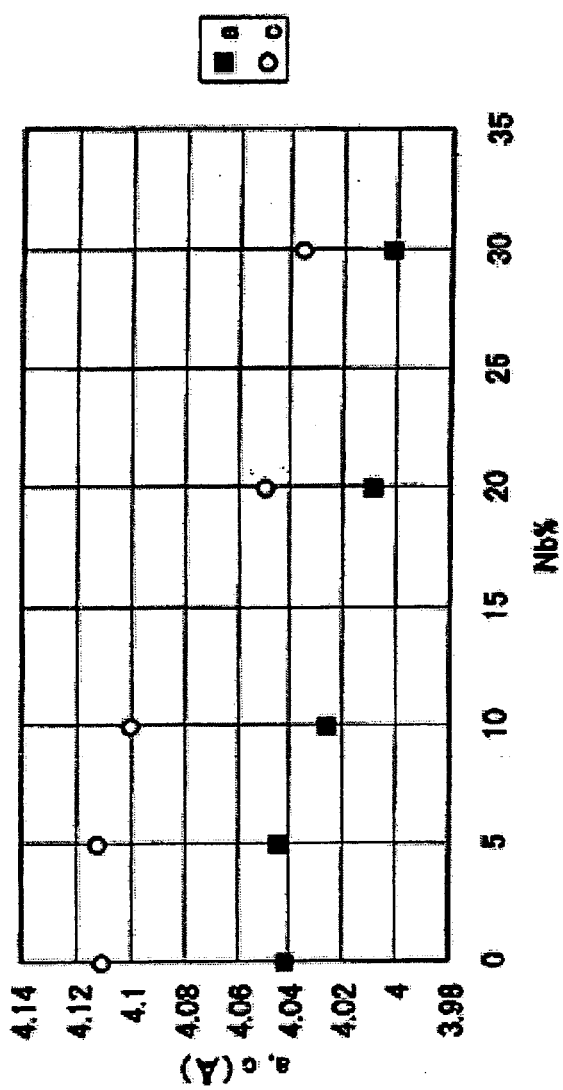
FIGS. 24(A) and (B) show figures for describing changes in lattice constant in a PZTN film in accordance with Embodiment Example 3 of the present embodiment.

In the present embodiment example, crystal lattice constants of PZTN films obtained wherein the amount of Nb added ranged from 0 mol % to 30 mol % were measured by using an X-ray diffraction method, and the results shown in FIGS. 24(A) and 24(B) were obtained. It is observed from FIGS. 24(A) and 24(B) that the lattice constant along the a axis (or the b axis) becomes closer to the lattice constant along the c axis as the amount of Nb added increases. Also, V(abc) in FIG. 24(A) is an index of a volumetric conversion of lattice constant (a,b,c). $V/V_0$ in FIG. 24(A) is the ratio of the index V(abc) of the PZTN crystal with respect to an index $V_0$ which is a volumetric conversion of lattice constant of a PZT crystal in which no Nb is added. It can be confirmed from the V(abc) or $V/V_0$ column that the crystal lattice of the PZTN crystal becomes smaller as the amount of Nb added increases.

Figure 25:
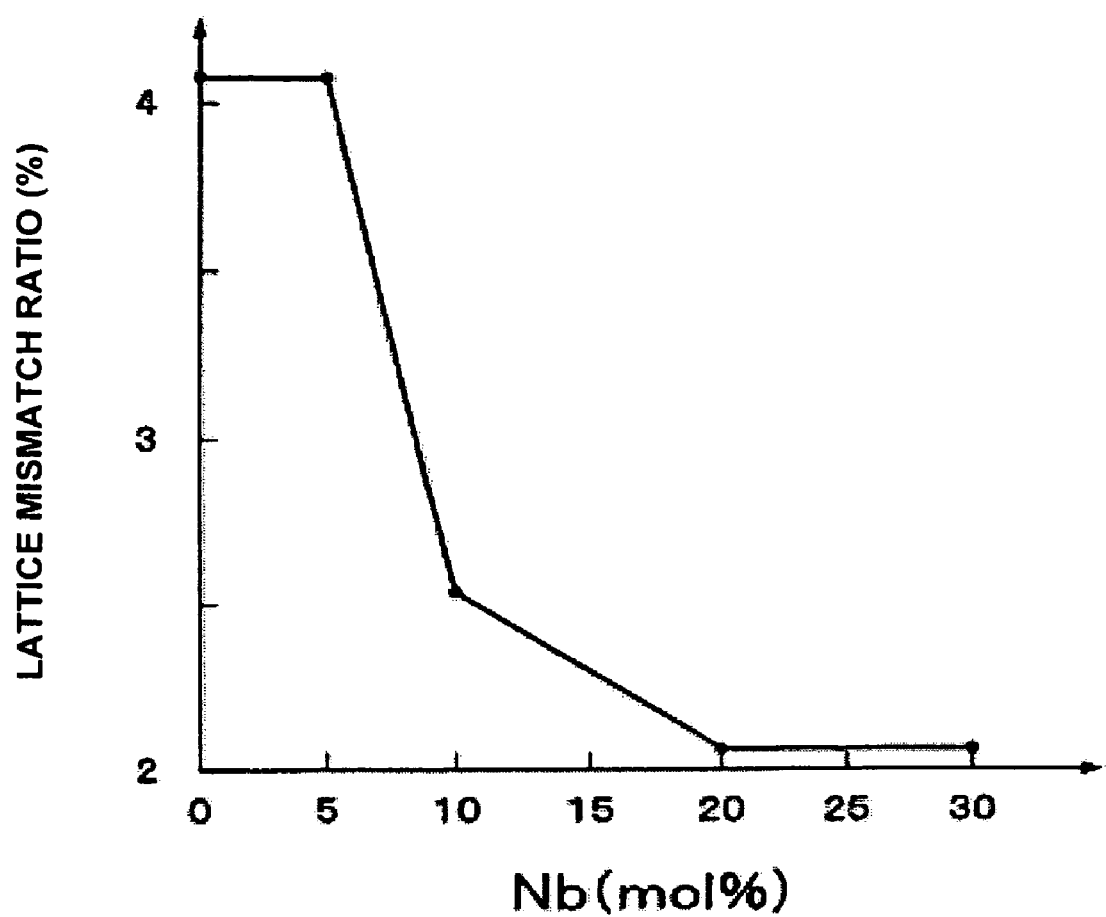
FIG. 25 shows a graph for describing changes in lattice mismatch ratio between PZTN films and Pt metal films in accordance with Embodiment Example 3 of the present embodiment.

Lattice mismatch ratios with respect to a lattice constant (a,b,c=3.96) of a Pt metal film were calculated based on the lattice constants of PZTN films formed with the addition of Nb in this manner, and the amounts of Nb added (mol %) were plotted along the horizontal axis in FIG. 25. It was confirmed from FIG. 25 that the effects of including Nb into a PZT-system ferroelectric film are not limited to the effect of improving the ferroelectric characteristic of each of the above described embodiments, but also include the effect of approximating the lattice constant thereof to the lattice constant of crystals of platinum-system metals such as Pt. It was confirmed that this effect is particularly obvious in the region in which the amount of Nb added is 5 mol % or greater.

It is therefore confirmed that the use of the method of the present invention reduces lattice mismatches between the metal film that is the electrode material and the ferroelectric layer, and the lattice mismatch ratio can be improved to about 2% when the amount of Nb added is 30 mol %, for example. It is believed that, because strong bonds having both ionic bonds and covalence bonds between Nb atoms that substitute for Ti atoms at the B sites and oxygen atoms in the PZTN crystal structure are generated, and these bonds act in directions that compress the crystal lattice, causing changes in the direction in which the lattice constant decreases.

In addition, platinum-system metals such as Pt are chemically stable substances that are ideal as electrode materials for ferroelectric memories and piezoelectric actuators, so that the method of the present embodiment example makes it possible to alleviate lattice mismatches more than in the conventional art, even when a PZTN film is formed directly on this Pt metal film, and also improves the interface characteristic thereof. The method of the present embodiment example therefore makes it possible to reduce fatigue deterioration of PZT-system ferroelectric layers, making it suitable for application to devices such as ferroelectric memories and piezoelectric actuators.

EMBODIMENT EXAMPLE 4

Figure 33:
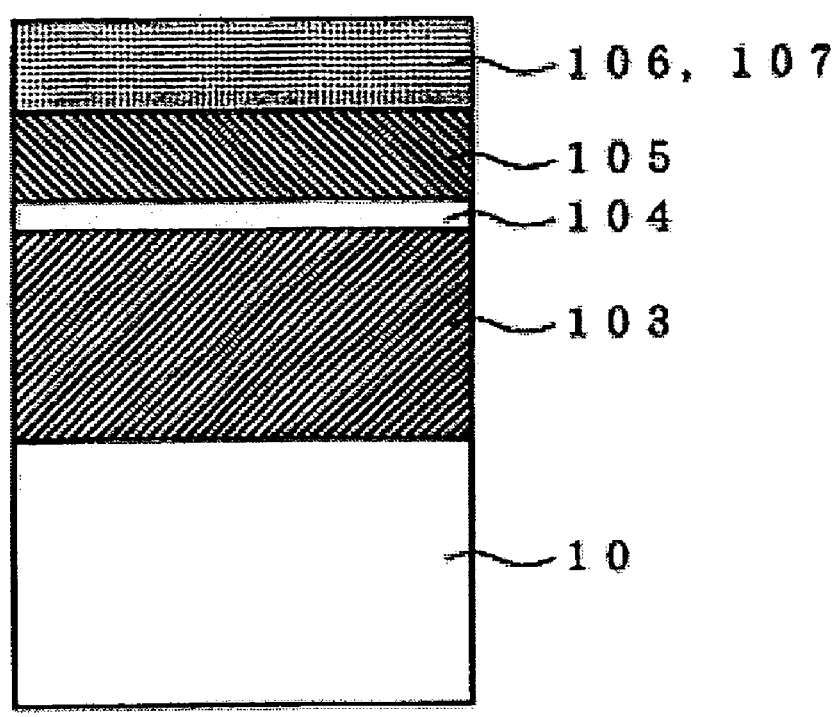
FIG. 33 shows a sample used in accordance with Embodiment Example 4 of the present embodiment.

Samples having a structure shown in FIG. 33 were manufactured, and rates of each element in the direction of depth were analyzed by a variety of methods. A method for manufacturing the samples is described below.

The surface of a silicon substrate 10 was thermally oxidized, whereby a silicon oxide layer 103 having a film thickness of about 400 nm was formed. Titanium was spattered in a film on the silicon oxide layer 103, and the film was sintered in oxygen, whereby a titanium oxide layer 104 having a thickness of about 40 nm was formed. By a two-stage film forming method that combines an ion sputter method and a vapor deposition method, a platinum layer (electrode) 105 having a film thickness of about 150 nm was formed on the titanium oxide layer 104.

Then, Pb $(Zr_{0.2}T_{0.6}Nb_{0.2})O_3$ (PZTN) was formed in a film on the platinum layer 105, and sintered in oxygen at 725° C. for crystallization, thereby forming a ferroelectric layer 106 having a film thickness of about 150 nm, whereby a sample of the present embodiment example was obtained. Also, layers up to the platinum layer 105 were formed in a similar manner, and further Pb $(Zr_{0.2}T_{0.8})O_3$ (PZT) was formed in a film on the platinum layer 105, and sintered in oxygen at 725° C. for crystallization, thereby forming a ferroelectric layer 107 having a film thickness of about 150 nm, whereby a comparison sample was obtained.

Figure 34:
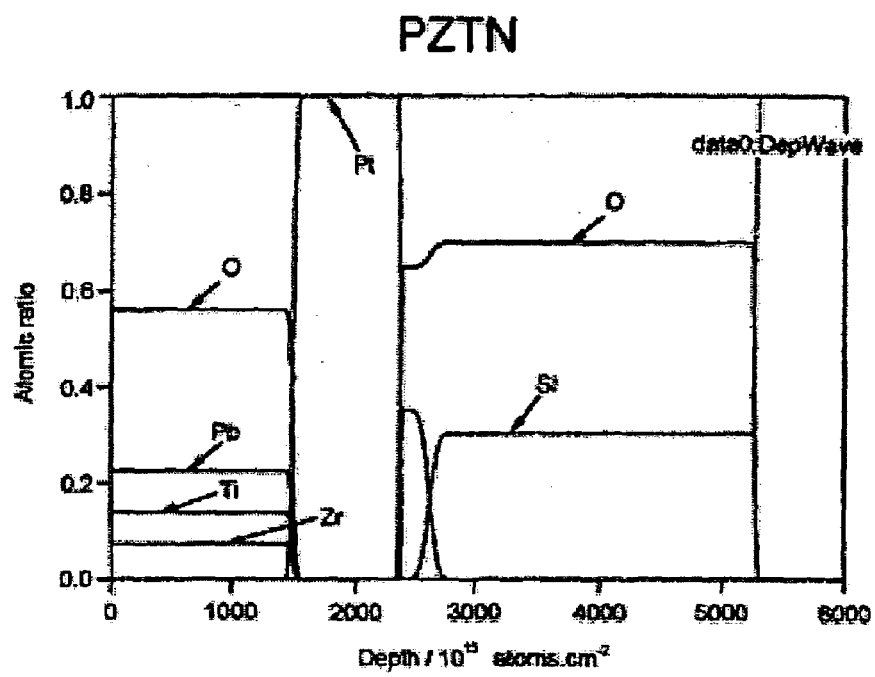
FIGS. 34(A) and (B) show the results of RBS and NRA analysis obtained in Embodiment Example 4.
Figure 34:
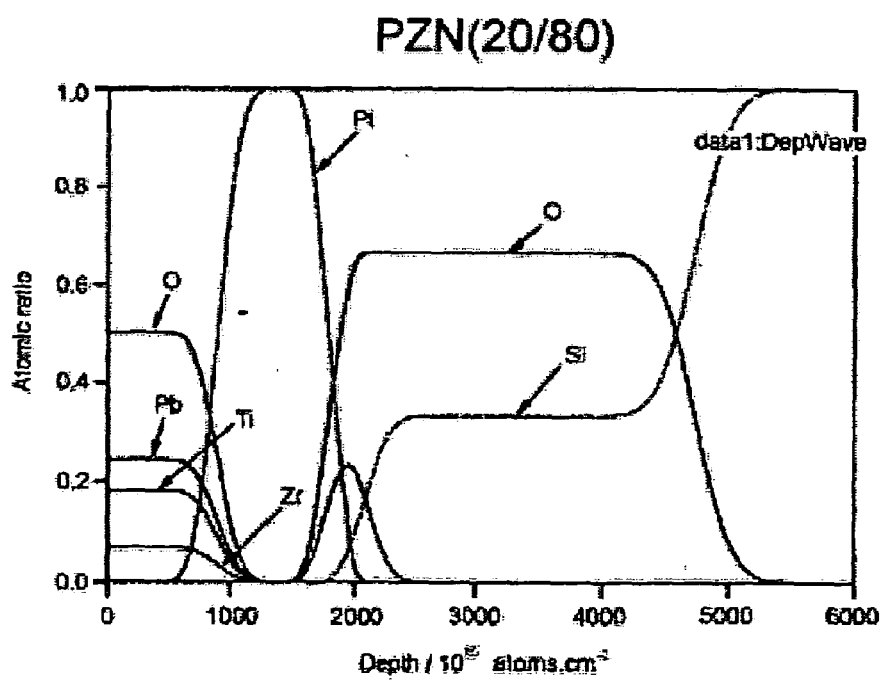

These samples were analyzed by RBS and NRA, and AES. FIGS. 34(A) and(B) show the analysis results by RBS and NRA. FIG. 34 (A) shows the analysis results of PZTN, and FIG. 34(B) shows the analysis results of PZT. FIGS. 35(A) and(B) show the analysis results by AES. FIG. 35(A) shows the analysis results of PZTN, and FIG. 35(B) shows the analysis results of PZT. It is noted that, in either of the analysis methods, because Zr and Nb whose atomic weights are close to each other cannot be completely distinguished, both are detected together.

Figure 35:
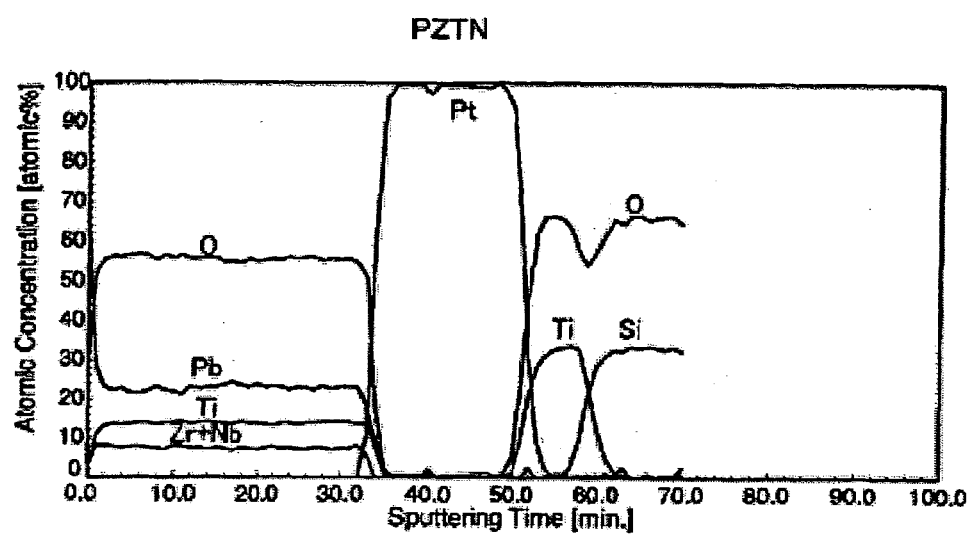
FIGS. 35(A) and (B) show the results of AES analysis obtained in Embodiment Example 4.
Figure 35:
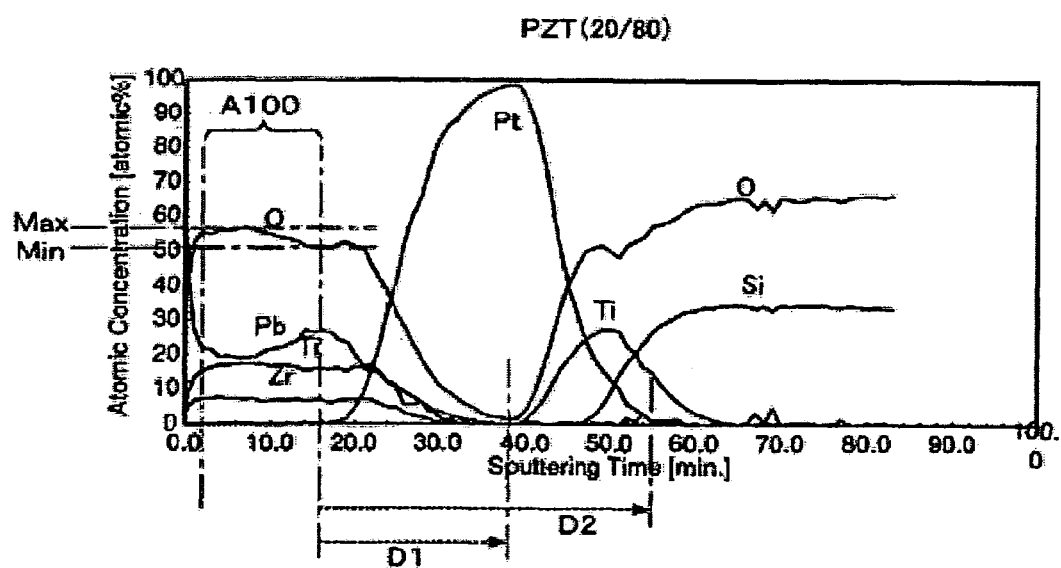

From the results shown in FIGS. 34(A) and(B), and FIGS. 35 (A) and(B), diffusion lengths of oxygen atoms to the electrode and difference in proportions of oxygen atoms in the ferroelectric layer in the samples of the embodiment example and comparison example were obtained. Methods to obtain these values are described below.

Diffusion Length of Oxygen Atoms

Figure 36:
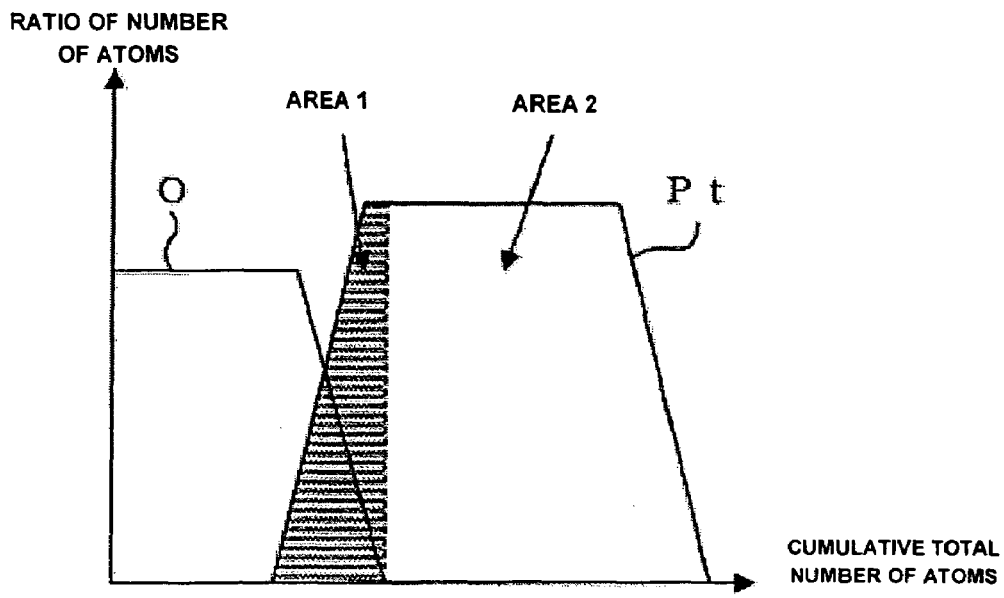
FIG. 36 illustrates a method to obtain a diffusion length of oxygen atoms according to the results of RBS and NRA analysis in Embodiment Example 4.
Figure 37:
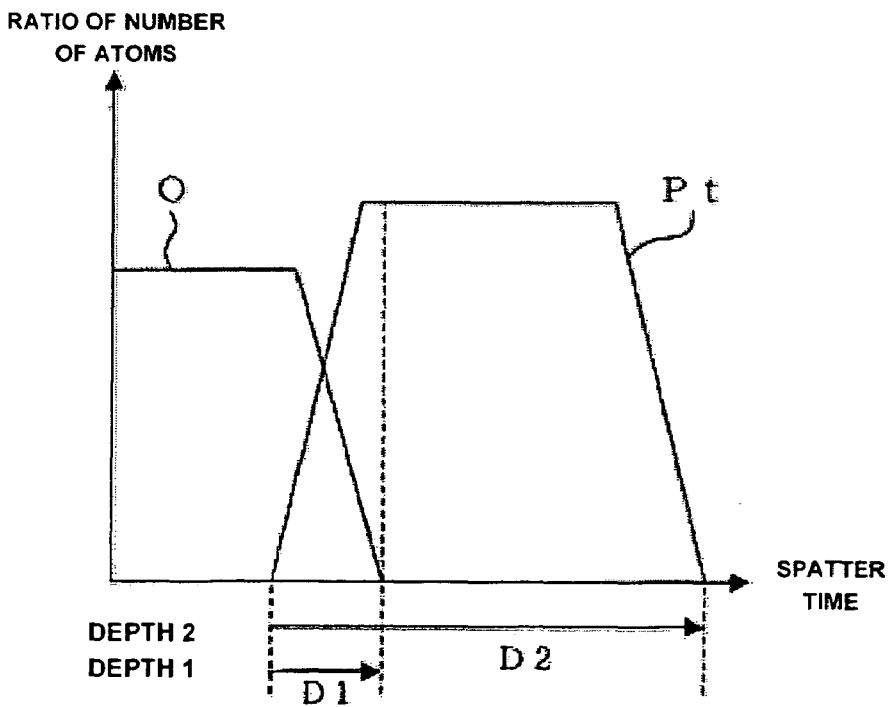
FIG. 37 illustrates a method to obtain a diffusion length of oxygen atoms according to the results of AES analysis in Embodiment Example 4.

Diffusion lengths of oxygen atoms in the electrode (platinum layer) were obtained by methods indicated in FIG. 36 and FIG. 37.

According to the analysis method that combines RBS and NRA, because the profile is specified by the total number of atoms, the diffusion length can be obtained by comparing areas of the peaks. More specifically, as shown in FIG. 36, an area of the platinum peak in a region where the skirt of the peak of oxygen atoms and the skirt of the peak of platinum atoms overlap each other is assumed to be "Area 1," and the total area of the platinum peak is assumed to be "Area 2," the diffusion length can be obtained by Formula (1) as follows.

Diffusion length=Film thickness of platinum layer×
(Area 1+Area 2)  Formula (1)

Also, since the depth is specified by the sputtering time in AES, the diffusion length is obtained by comparing lengths, while assuming that the sputter rate is constant. More specifically, as shown in FIG. 37, the width of depth of a region where the skirt of the peak of oxygen atoms and the skirt of the peak of platinum atoms overlap each other is assumed to be "Depth 1 (D1)," and the total area of the platinum peak is assumed to be "Depth 2 (D2)," the diffusion length can be obtained by Formula (2) as follows. D1 and D2 are shown in FIG. 35 (B) as a concrete example for easy understanding.

Diffusion length=Film thickness of platinum layer×
Depth 1/Depth 2  Formula (2)

By using Formula (1) and Formula (2) above, the diffusion length of oxygen atoms of the sample of the embodiment example was obtained by the RBS+NRA analysis, and it was 15 nm. Also, the diffusion length of oxygen atoms of the sample of the embodiment example was obtained by the AES analysis, and it was 30 nm. In contrast, the diffusion length of oxygen atoms of the sample of the comparison example obtained by the RBS+NRA analysis was about 70 nm, and it was 90 nm by the AES analysis.

As seen from the above, in either of the analysis methods, it was affirmed that the diffusion length of oxygen in the sample of the embodiment example was substantially shorter compared with the diffusion length of oxygen in the sample of the comparison example.

The present embodiment example was conducted by using the samples that were heat-treated under the condition of high temperature (725° C.), and the numerical values of the above-described diffusion lengths of oxygen atoms were obtained under severe conditions. Therefore, if samples of the embodiment example are made by other conditions, it is predicted that the diffusion lengths of oxygen atoms thereof obtained by the RBS+NRA analysis would be 15 nm or less. Also, similarly, it is predicted that the diffusion lengths of oxygen atoms of samples of the present embodiment example made by other conditions obtained by the AES analysis would be 30 nm or less.

Difference in Proportions of Oxygen Atoms

A difference in proportions of oxygen atoms in the ferroelectric layer was obtained by Formula (3) as follows. In the following formula, "Maximum value" and "Minimum value" indicate the maximum value and the minimum value of the oxygen peak in a region excluding the diffusion areas. For example, as shown in FIG. 35(B), the maximum value (Max) and the minimum value (Min) are obtained in a region A100 among the oxygen peak excluding regions where lead noticeably diffuses and platinum diffuses.

Difference=(Max−Min)/(Average of Max and Min)  Formula (3)

By using Formula (3) above, the difference in proportions of oxygen atoms of the sample of the embodiment example was obtained according to the RBS+NRA analysis, and it was 1%. Also, the difference in proportions of oxygen atoms of the sample of the embodiment example was obtained by the AES analysis, and it was 3%. The difference in proportions of oxygen atoms of the sample of the comparison example obtained according to the RBS+NRA analysis did not show a substantial difference compared with the embodiment examples (however, the number of oxygen atoms that existed in the diffusion area was considerably larger compared with the embodiment examples). In contrast, it was confirmed that there was a difference of 8% according to the AES analysis.

The present embodiment example was conducted by using the samples that were heat-treated under a high temperature condition (at 725° C.), and the numerical values of the above-described difference in proportions of oxygen atoms were obtained under severe conditions. Therefore, if samples of the embodiment example are made by other conditions, it is predicted that the difference in proportions of oxygen atoms thereof obtained by the RBS+NRA analysis would be 1% or less. Also, similarly, it is predicted that the difference in proportions of oxygen atoms of samples of the present embodiment example made by other conditions obtained according to the AES analysis would be 8% or less.

As indicated above, according to the AES analysis, in particular, it was confirmed that the difference of oxygen atoms in the samples of the embodiment example is considerably small compared with the difference of oxygen atoms in the sample of the comparison example. Therefore, it was confirmed that the ferroelectric layer according to the present invention has an almost constant distribution of proportion of oxygen atoms in the direction of depth of the ferroelectric layer.

The difference between the above-described PZTN and PZT is considered to be derived from the following reasons.

When diffusion of an element at the interface of solid materials is considered, and the diffusion coefficient is assumed to be D, D can be expressed by $D=a^2/t \cdot \exp(-E/kT)$, wherein a is a distance between particles, 1/t is a frequency in which a leap between particles occurs, and E is activation energy.

It is noted here that 1/t becomes greater by vacancy of the element. Therefore, the difference in the degree of diffusion between PZT and PZTN can be explained as follows.

When a PZT film is heat-treated, Pb and O escape from within the PZT film, and Pb and O vacancies are generated therein. In particular, when O vacancies are generated, scattering of O atoms occurs because O atoms more readily move than other elements. In addition, the balance of charge collapses by the O vacancies, such that Pb, Zr and Ti in the film become unstable. Further, the diffusion coefficients of these elements become larger.

In PZTN, in particular, the diffusion coefficient of O element can be suppressed in order to prevent O vacancies. For this reason, diffusion by heat-treatment can be considerably suppressed compared with the case of PZT. Thus, because PZTN has very few defects in its crystals, the PZTN film itself functions as an oxygen barrier film. For example, for a stacked type FeRAM, a complex electrode structure is currently needed in the technology to prevent oxidation of tungsten plugs, but the same can be omitted by using PZTN because of the characteristics of PZTN described above.

REFERENCE EXAMPLE

In the present example, $PbZr_{0.4}Ti_{0.6}O_3$ ferroelectric films were manufactured.

A solution including about 20% excess Pb is used for the conventional method, but this is to restrain volatile Pb and reduce the crystallization temperature. However, since it is unclear as to how the excess Pb acts in the completed thin films, the amount of excess Pb should be suppressed to a minimum.

Figure 26:
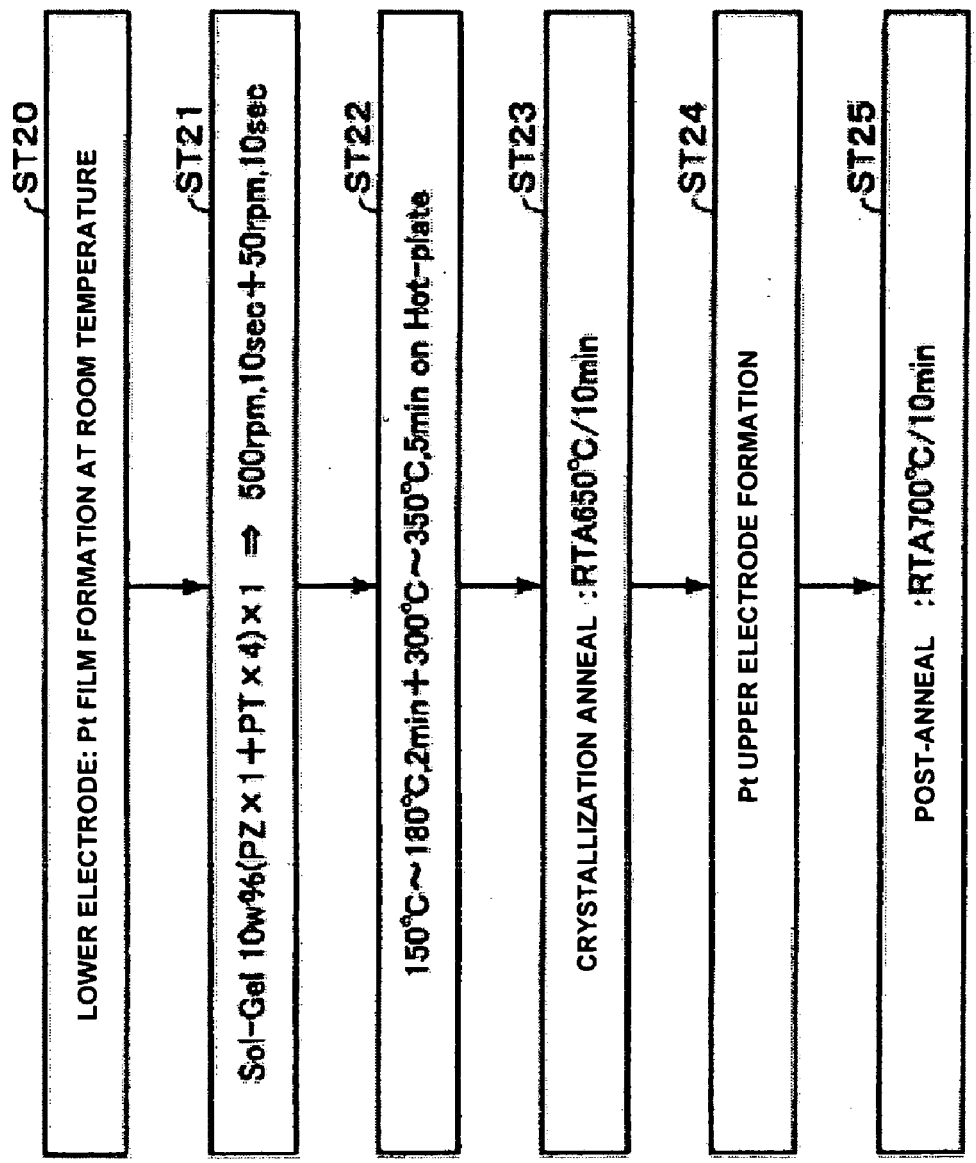
FIG. 26 shows a flowchart of a method for forming a conventional PZT film by a spin coat method, as a reference example considered in the present embodiment.
Figure 27:
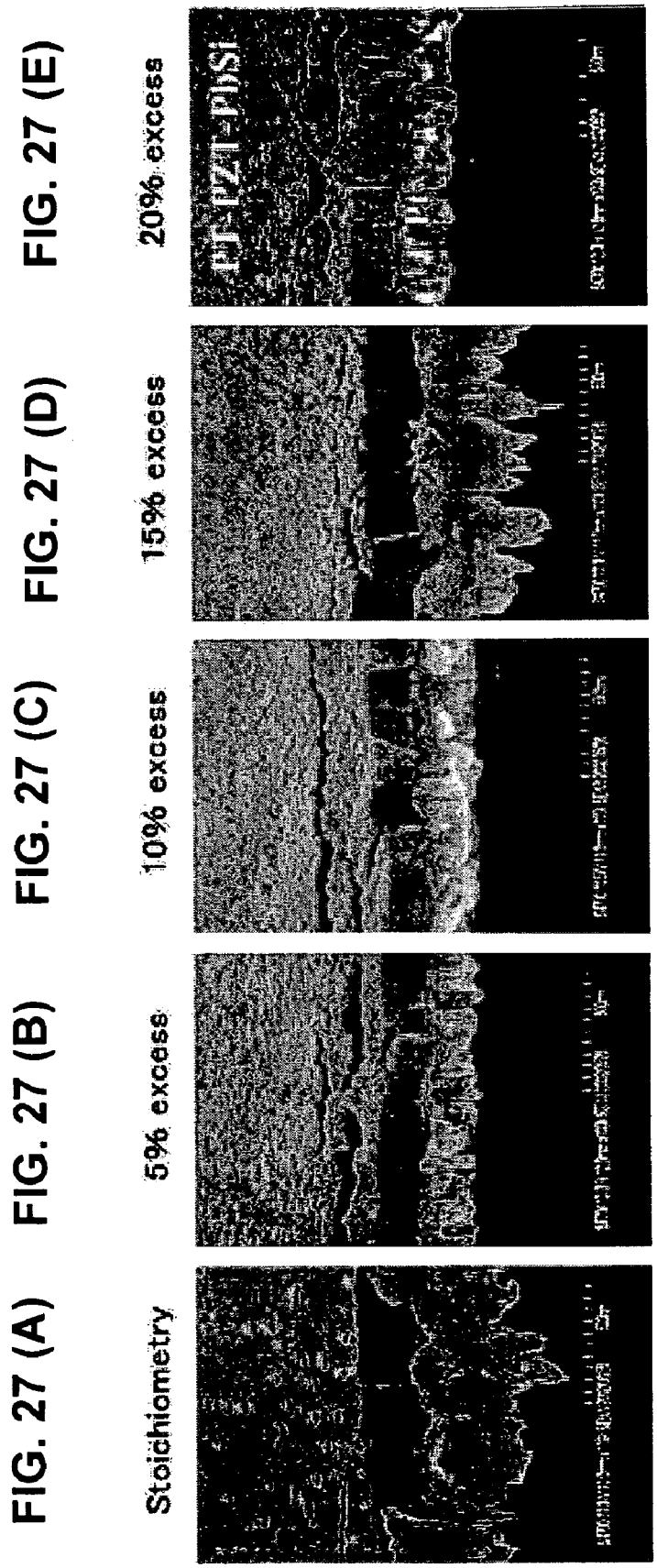
FIGS. 27(A)-(E) show the surface morphologies of PZT films, as reference examples of the present embodiment.
Figure 28:
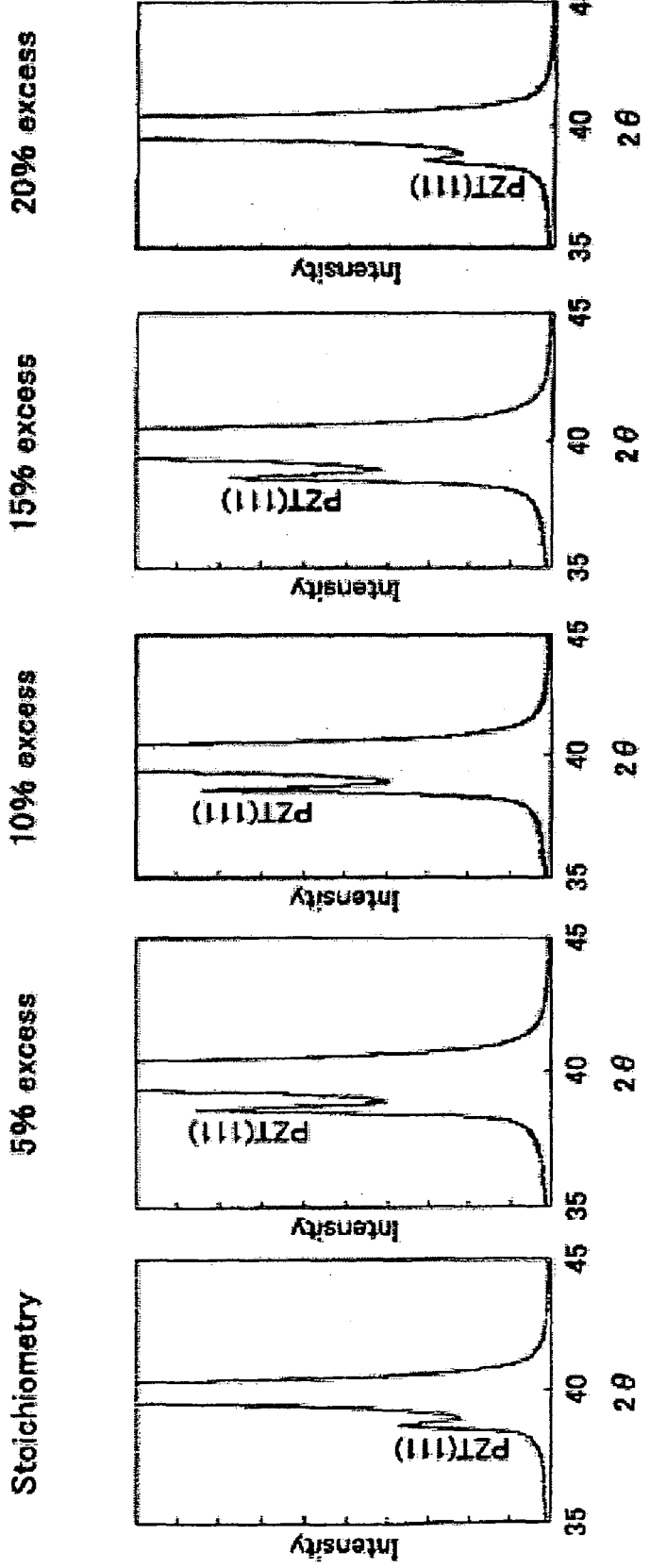
FIGS. 28(A)-(E) show the crystallinity of PZT films, as reference examples of the present embodiment.

Accordingly, sol-gel solutions for forming $PbZr_{0.4}Ti_{0.6}O_3$ of 10 wt % concentration (solvent: n-butanol) containing an excess of 0, 5, 10, 15, and 20% of Pb, each of which was further added 1 mol % of a sol-gel solution for forming $PbSiO_3$ of 10 wt % concentration (solvent: n-butanol), were used to form $PbZr_{0.4}Ti_{0.6}O_3$ ferroelectric films having a thickness of 200 nm through conducting steps ST20 to ST25 of FIG. 26. Surface morphologies in this case are shown in FIGS. 27(A) to 27(C), and XRD patterns thereof are shown in FIGS. 28(A) to 28(C).

Although an excess of about 20% of Pb was necessary in the conventional art, it was indicated that crystallization proceeded sufficiently with an excess of 5% of Pb. This shows that the addition of mere 1 mol % of $PbSiO_3$ catalyst lowers the crystallization temperature of PZT, so that almost no excess Pb is needed. Thereafter, a solution containing an excess of 5% of Pb has always been used for forming PZT, $PbTiO_3$, and $PbZrTiO_3$.

Figure 29:
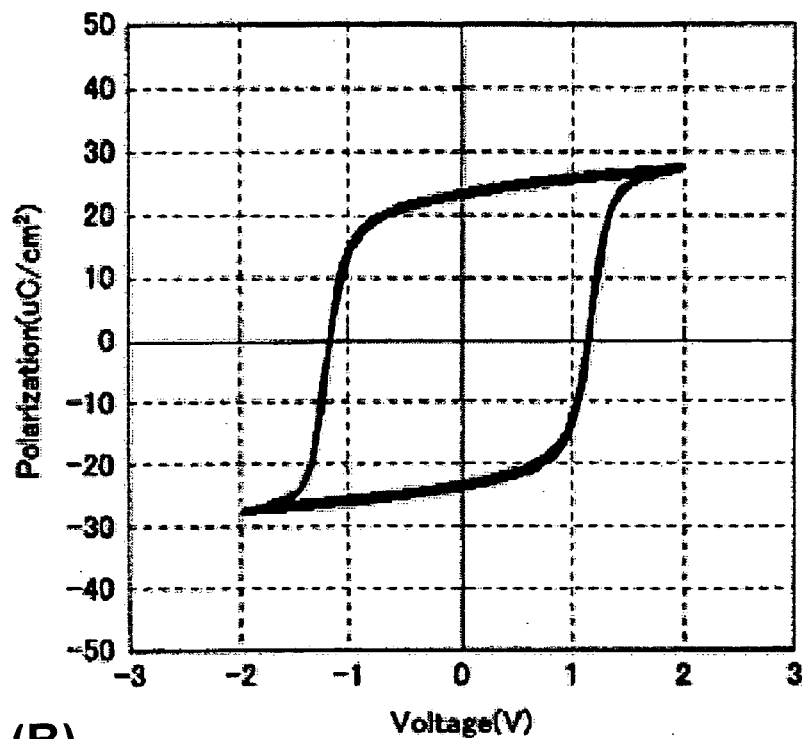
FIGS. 29(A) and (B) show the hysteresis loops of tetragonal PZT films, as reference examples of the present embodiment.
Figure 29:
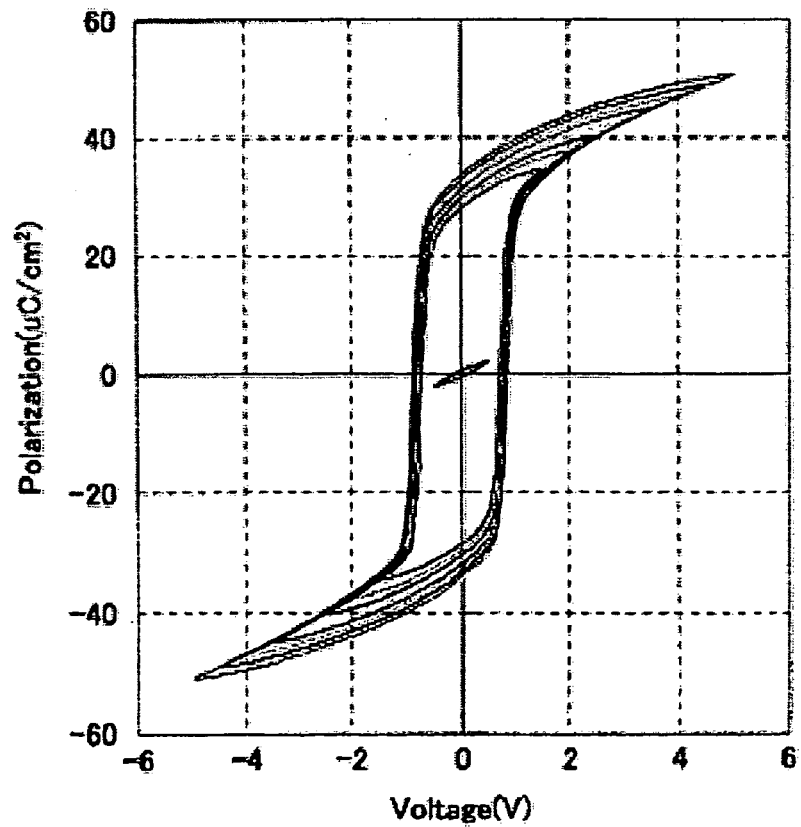

Next, a sol-gel solution for forming $PbZrO_3$ of 10 wt % concentration (solvent: n-butanol) and a sol-gel solution for forming $PbTiO_3$ of 10 wt % concentration (solvent: n-butanol) were mixed in the ratio of 4:6 to form a mixed solution, which was further added 1 mol % of a sol-gel solution for forming $PbSiO_3$ of 10 wt % concentration (solvent: n-butanol). By using this mixed solution, $PbZr_{0.4}Ti_{0.6}O_3$ ferroelectric layers having a thickness of 200 nm were manufactured in accordance with the process flow shown in FIG. 26. Their hysteresis characteristics in this case had good squareness, as shown in FIGS. 29(A) and 29(B). However, it was found that they were also leaky.

Figure 30:
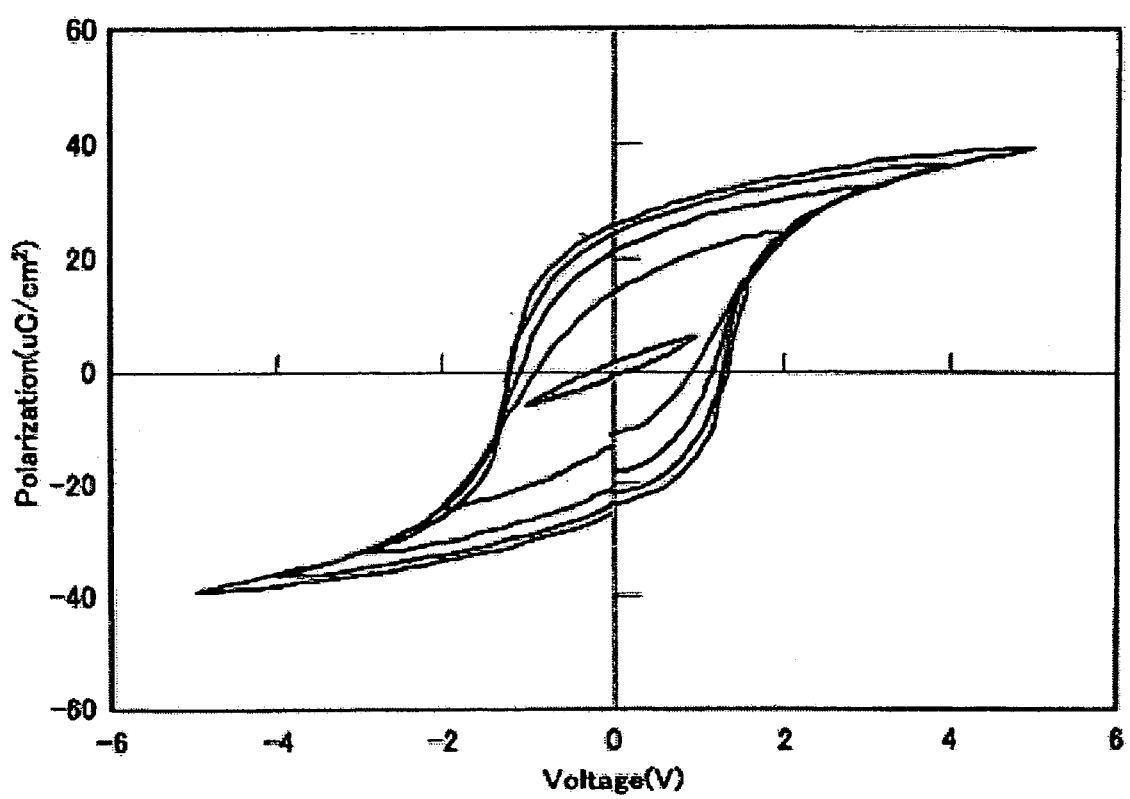
FIG. 30 shows the hysteresis loops of conventional tetragonal PZT films, as reference examples considered in the present embodiment.

For comparison, a sol-gel solution for forming $PbZr_{0.4}Ti_{0.6}O_3$ of 10 wt % concentration (solvent: n-butanol) was added 1 mol % of a sol-gel solution for forming $PbSiO_3$ of 10 wt % concentration (solvent: n-butanol) to form a mixed solution, and by using the mixed solution, a $PbZr_{0.4}Ti_{0.6}O_3$ ferroelectric layer having a thickness of 200 nm was manufactured by a conventional method and according to the above-described process flow of FIG. 26. As shown in FIG. 30, the hysteresis characteristic in this case was not particularly good.

Figure 31:
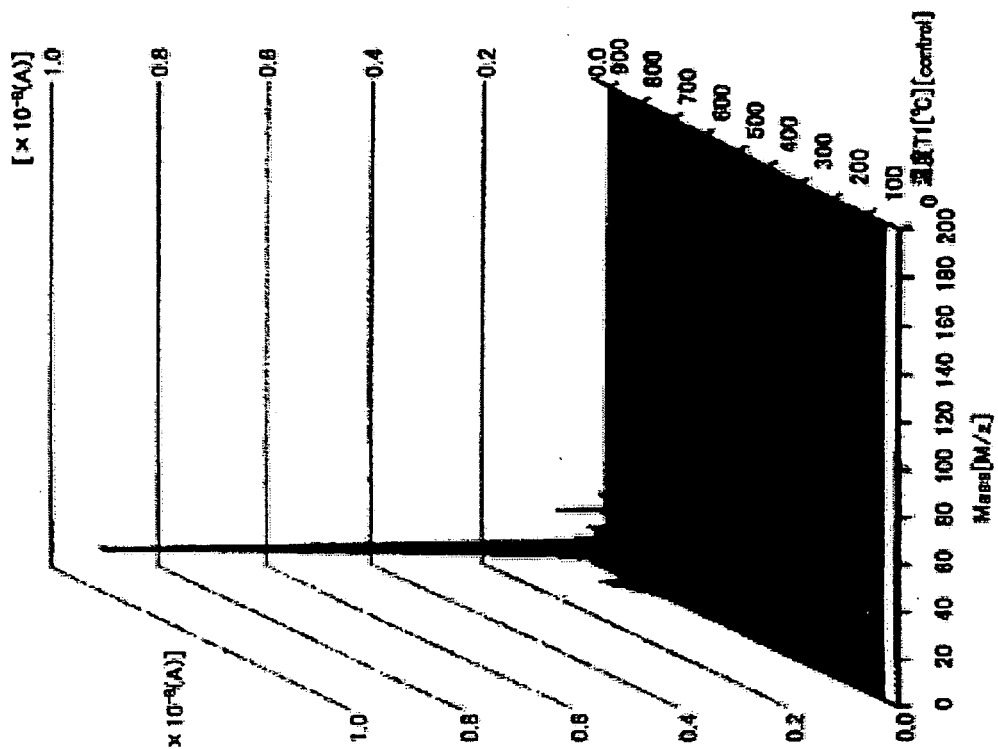
FIGS. 31(A) and (B) show the results of degassing analysis conducted on tetragonal PZT films, as reference examples of the present embodiment.
Figure 31:
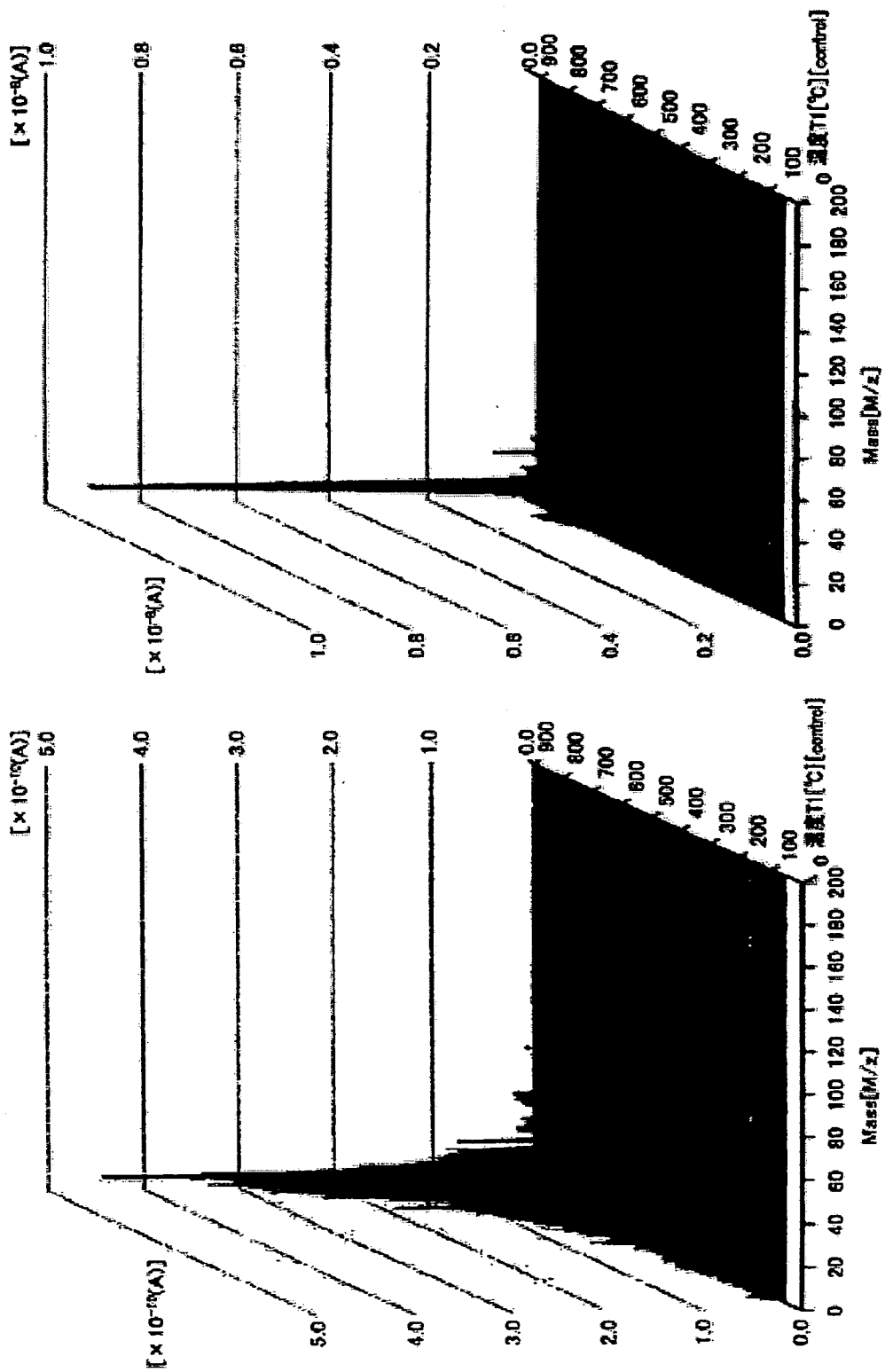

Degassing analysis was performed on each of these ferroelectric layers, and the results shown in FIGS. 31(A) and 31(B) were obtained As shown in FIG. 31(A), it was confirmed that the conventional ferroelectric layers manufactured by PZT sol-gel solutions always had degassing with respect to H and C, from room temperature to elevated temperatures up to 1000° C.

On the other hand, as shown in FIG. 31(B), in the case of the ferroelectric layers of the present invention formed by using a solution in which a sol-gel solution for forming $PbZrO_3$ of 10 wt % concentration (solvent: n-butanol) and a sol-gel solution for forming $PbTiO_3$ of 10 wt % concentration (solvent: n-butanol) are mixed in a ratio of 4:6, it was found that almost no degassing occurred until they dissolved.

The above is believed to have occurred because the use of a solution in which a sol-gel solution for forming $PbZrO_3$ of 10 wt % concentration (solvent: n-butanol) and a sol-gel solution for forming $PbTiO_3$ of 10 wt % concentration (solvent: n-butanol) are mixed in a ratio of 4:6 ensures that $PbTiO_3$ initially crystallizes on Pt from the sol-gel solution for forming $PbTiO_3$ of 10 wt % concentration (solvent: n-butanol) in the mixed solution, which become crystallization initial seeds, and also that lattice mismatches between Pt and PZT are cancelled, facilitating the crystallization of PZT. It is also considered that the use of the mixed solution forms a suitable interface between $PbTiO_3$ and PZT, which is lead to the favorable squareness of hysteresis.

Ferroelectric Memory

Figure 38:
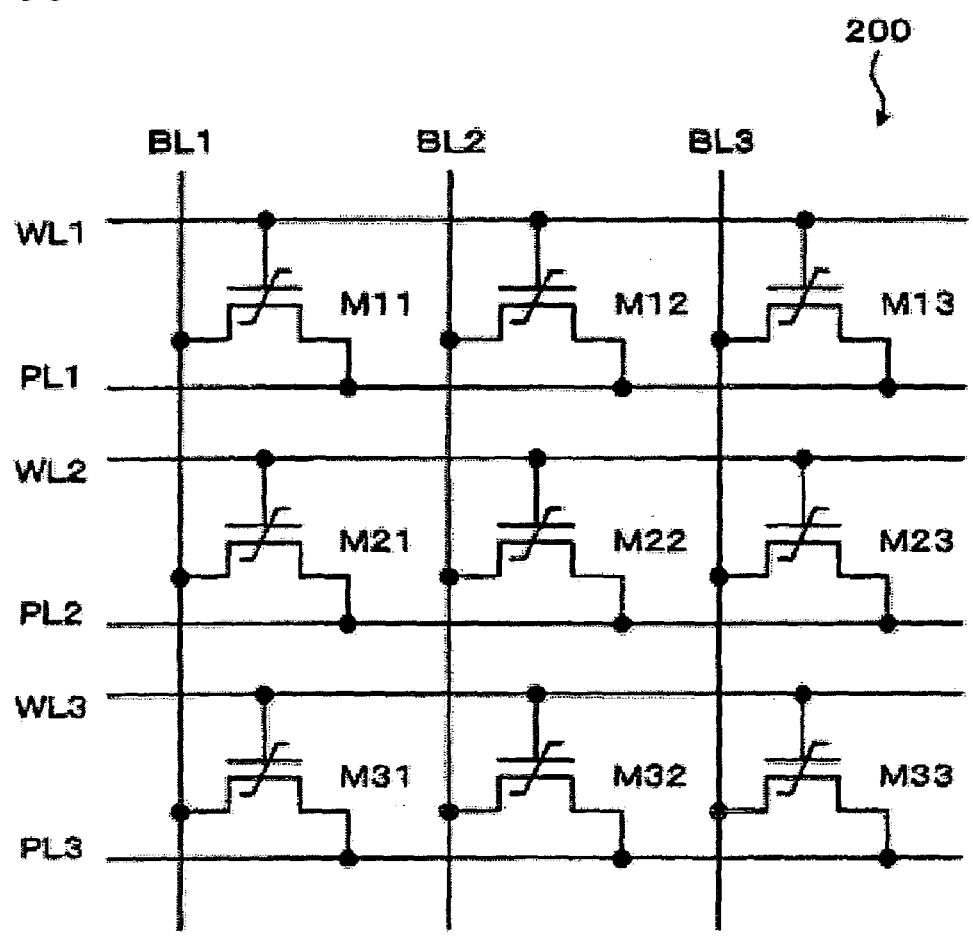
FIG. 38 shows a diagram showing a circuit configuration of a ferroelectric memory in accordance with an embodiment.

FIG. 38 is a diagram showing a circuit configuration of a ferroelectric memory 200 including a MFS type field-effect transistor in accordance with an embodiment of the present invention.

In the ferroelectric memory 200, each memory cell M11 . . . M33 is composed of an MFS type field-effect transistor 100 (see FIG. 1), consisting of a single MOS transistor equipped with a ferroelectric capacitor at its gate section. Sources of the MOS transistors composing the MFS type field effect transistors in the ferroelectric memory 200 are connected to bit lines BL1 . . . BL3 through plugs, respectively. Also, drains of the MOS transistors are connected to plate line PL1 . . . PL3 through plugs, respectively. Ferroelectric capacitors are formed at gate sections, and upper portions of the ferroelectric capacitors are connected to word lines WL1 . . . WL3. Channels are formed between the sources and the drain of the MOS transistor, respectively. The example shown in FIG. 38 is just an example, and for example, the plate lines may be fixed to ground, or may be formed in an operable manner. Further, the word lines may be connected through plugs, or without plugs. Also, channels inverted with respect to the sources or the drains may be formed at the gate sections, or such channels may not be formed.

A method for writing information in memory cells composed of MFS type field effect transistors is described below. For example, when the memory cell M11 in FIG. 38 is made a selected memory cell, a voltage Vw or 0V is impressed to the word line WL1 and the bit line BL1. As a result, a predetermined voltage is applied across the source and the gate, and desired information is written in the corresponding ferroelectric capacitor. In this instance, a voltage of (2Vw)/3 or Vw/3 is applied to the word lines other than WL1 and the bit lines other than BL1 such that erroneous data erasures by data disturb would not occur in non-selected memory cells. When information opposite to the aforementioned written information is written, a voltage that is to be applied to the word line and the bit line is opposite with respect to the afore-mentioned case.

Next, a readout method is described. In this case, a voltage Vr is impressed to a plate line (PL1) corresponding to a selected memory cell. The voltage Vr does not need to be the same as the voltage Vw, but may desirably be a voltage that does not influence data of the ferroelectric capacitor. Information written in the memory cell can be read by detecting the current from a bit line (BL1) corresponding to the selection memory cell. In the ferroelectric memory 200 shown in FIG. 38, information comes out from other memory cells that share the plate line PL1, but this does not destroy the information.

Since the ferroelectric layer of each memory cell composed of the MFS type field effect transistor used in this embodiment is configured with the PZTN described above, the squareness of the hysteresis loop is very good and it has a stable disturbance characteristic. Moreover, the ferroelectric layer consisting of PZTN does not diffuse oxygen, and has a high level of oxygen barrier property, such that a paraelectric film of silicon oxide, or the like is not generated easily in the interface between the semiconductor layer (for example, silicon layer) 10 and the ferroelectric layer 15. Therefore, because a ferroelectric layer can be formed directly on the semiconductor layer, the MFS type field effect type transistor can be achieved according to the present embodiment. In addition, the ferroelectric layer that consists of PZTN is excellent in the hysteresis characteristic, the leakage characteristic, the fatigue characteristic, and the imprint characteristic, such that a MFS type field effect type transistor having excellent characteristics as a memory device can be achieved. Therefore, by using such a ferroelectric layer, the practical use of a ferroelectric memory 200 using a MFS type field-effect transistor becomes possible. Thus, the ferroelectric memories in accordance with the present embodiment and semiconductor devices with the ferroelectric memories mounted thereon are capable of higher integration, and non-destructive reading.

The present invention has been described above with reference to preferred embodiments thereof, but the present invention is not limited to those describe above, and a variety of changes according to modified embodiments can be implemented within the range of the subject matter of the invention.

What is claimed is:

1. A Metal Ferroelectric Semiconductor (MFS type) field effect transistor comprising:
   a semiconductor layer formed of Si;
   a PZT system ferroelectric layer formed directly on the semiconductor layer;
   a gate electrode formed of one selected from the group consisting of Pt, Ir, and Ru is formed directly on the PZT system ferroelectric layer;
   an pair of impurity layers composing a source or a drain, formed in the semiconductor layer directly adjacent the PZT system ferroelectric layer; and
   a pair of element isolation regions formed directly on the semiconductor layer directly adjacent the impurity layers,
   wherein the PZT system ferroelectric layer includes an Nb composition that replaces a Ti composition by 20 mol %.

2. The MFS type field effect transistor according to claim 1, wherein a diffusion length of oxygen in the gate electrode from the PZT system ferroelectric layer is 15 nm or less, as obtained from a profile according to a Rutherford backscattering analysis method (RBS) and a nuclear reaction analysis method (NRA).

3. The MFS type field effect transistor according to claim 1, wherein a diffusion length of oxygen in the gate electrode from the PZT system ferroelectric layer is 30 nm or less, as obtained from a profile according to an Auger electron spectroscopy (AES).

4. The MFS type field effect transistor according to claim 1, wherein the PZT system ferroelectric layer has a generally constant distribution of proportion of oxygen atoms in the PZT system ferroelectric layer.

5. The MFS type field effect transistor according to claim 4, wherein the distribution of proportion of oxygen atoms in the PZT system ferroelectric layer is 1% or less, when a difference in proportions of oxygen atoms in the PZT system ferroelectric layer in a film thickness direction thereof is expressed by (a maximum value–a minimum value)/(an average value of the maximum value and the minimum value) and obtained from a profile according to a Rutherford backscattering analysis method (RBS) and a nuclear reaction analysis method (NRA).

6. The MFS type field effect transistor according to claim 4, wherein the distribution of proportion of oxygen atoms in the PZT system ferroelectric layer is 3% or less, when a difference in proportions of oxygen atoms in the PZT system ferroelectric layer in a film thickness direction thereof is expressed by (a maximum value–a minimum value)/(an average value of the maximum value and the minimum value) and obtained from a profile according to an Auger electron spectroscopy (AES).

7. The MFS type field effect transistor according to claim 1, wherein, in the PZT system ferroelectric layer, 95% or more of oxygen contained in the PZT system ferroelectric layer exists at positions of oxygen of a perovskite structure.

8. The MFS type field effect transistor according to claim 1, wherein the PZT system ferroelectric layer contains a Ti composition more than a Zr composition.

9. The MFS type field effect transistor according to claim 1, wherein the PZT system ferroelectric layer has a crystal structure of at least one of tetragonal and rhombohedral systems.

10. The MFS type field effect transistor according to claim 9, wherein the PZT system ferroelectric layer consists of a tetragonal system, and has a (111) orientation.

11. The MFS type field effect transistor according to claim 1, wherein the PZT system ferroelectric layer includes 0.5 mol % or more of Si, or Si and Ge.

12. The MFS type field effect transistor according to claim 1, wherein the PZT system ferroelectric layer includes 0.5 mol % or more but less than 5 mol % of Si, or Si and Ge.

13. A ferroelectric memory using the MFS type field effect transistor recited in claim 1.

14. A semiconductor device using the ferroelectric memory recited in claim 13.

* * * * *